US011152204B2

(12) United States Patent
Nakai et al.

(10) Patent No.: US 11,152,204 B2
(45) Date of Patent: Oct. 19, 2021

(54) SUBSTRATE PROCESSING METHOD AND SUBSTRATE PROCESSING APPARATUS

(71) Applicant: SCREEN Holdings Co., Ltd., Kyoto (JP)

(72) Inventors: Hitoshi Nakai, Kyoto (JP); Tsutomu Osuka, Kyoto (JP); Naohiko Yoshihara, Kyoto (JP); Yasunori Kanematsu, Kyoto (JP); Manabu Okutani, Kyoto (JP); Kenji Amahisa, Kyoto (JP); Masayuki Hayashi, Kyoto (JP)

(73) Assignee: SCREEN Holdings Co., Ltd.

( * ) Notice: Subject to any disclaimer, the term of this patent is extended or adjusted under 35 U.S.C. 154(b) by 0 days.

(21) Appl. No.: 16/886,839

(22) Filed: May 29, 2020

(65) Prior Publication Data

US 2020/0381246 A1 Dec. 3, 2020

(30) Foreign Application Priority Data

May 31, 2019 (JP) .............................. JP2019-103277

(51) Int. Cl.
*H01L 21/02* (2006.01)
*B08B 3/08* (2006.01)
(Continued)

(52) U.S. Cl.
CPC .......... *H01L 21/02057* (2013.01); *B08B 3/08* (2013.01); *H01L 21/67051* (2013.01); *H01L 21/68742* (2013.01); *H01L 21/68764* (2013.01)

(58) Field of Classification Search
CPC ......... H01L 21/02057; H01L 21/68764; H01L 21/68742; H01L 21/67051; H01L 21/67028; H01L 21/67103; H01L 21/67023; H01L 21/6715; H01L 21/02008; H01L 21/0201; B08B 3/08
See application file for complete search history.

(56) References Cited

U.S. PATENT DOCUMENTS

| 10,115,610 B2 | 10/2018 | Yagi |
| 2003/0010671 A1 * | 1/2003 | Orii ..................... C03C 23/0075 |
| | | 206/710 |

(Continued)

FOREIGN PATENT DOCUMENTS

JP 6330998 B2 5/2018

*Primary Examiner* — Alexander Markoff
(74) *Attorney, Agent, or Firm* — Ostrolenk Faber LLP

(57) ABSTRACT

A substrate processing method includes an intermediate processing step of processing the pattern forming surface by the intermediate processing liquid after a chemical liquid processing step, a filler discharging step of discharging a filler after the intermediate processing step, a filler spreading step of spreading the filler, a solidified film forming step of solidifying the filler, a lower position disposing step of making a blocking member be disposed at a lower position prior to start of the chemical liquid processing step, and a blocking member elevating step of starting elevation of the blocking member toward an upper position in a state where the pattern forming surface is covered with the intermediate processing liquid. The chemical liquid is discharged from a central nozzle. Spreading of the filler is started in a state where the blocking member is positioned at the upper position.

20 Claims, 17 Drawing Sheets

(51) Int. Cl.
*H01L 21/687* (2006.01)
*H01L 21/67* (2006.01)

(56) References Cited

U.S. PATENT DOCUMENTS

| | | | | |
|---|---|---|---|---|
| 2003/0172955 | A1* | 9/2003 | Kuroda | H01L 21/67051 134/2 |
| 2007/0295365 | A1* | 12/2007 | Miya | H01L 21/67051 134/26 |
| 2008/0078426 | A1* | 4/2008 | Miya | H01L 21/67051 134/30 |
| 2009/0032067 | A1* | 2/2009 | Kojimaru | H01L 21/67034 134/26 |
| 2012/0090647 | A1* | 4/2012 | Miya | H01L 21/67051 134/30 |
| 2012/0175819 | A1* | 7/2012 | Miya | B08B 3/10 264/334 |
| 2014/0060423 | A1* | 3/2014 | Nakai | H01L 21/30604 118/50 |
| 2014/0174483 | A1* | 6/2014 | Miya | H01L 21/67051 134/30 |
| 2014/0227883 | A1* | 8/2014 | Izumoto | H01L 21/02052 438/745 |
| 2014/0273498 | A1* | 9/2014 | Kobayashi | C23C 16/4584 438/745 |
| 2014/0290703 | A1* | 10/2014 | Kobayashi | H01L 21/68792 134/33 |
| 2015/0251211 | A1* | 9/2015 | Tachibana | H01L 21/68742 118/704 |
| 2015/0279708 | A1* | 10/2015 | Kobayashi | C23C 16/458 438/747 |
| 2016/0336169 | A1* | 11/2016 | Fujiwara | B08B 3/02 |
| 2017/0117135 | A1* | 4/2017 | Yoshida | H01L 21/67051 |
| 2017/0243736 | A1* | 8/2017 | Kobayashi | B08B 3/022 |
| 2018/0076018 | A1* | 3/2018 | Otsuji | H01L 21/02052 |
| 2018/0085780 | A1 | 3/2018 | Kanematsu | |
| 2018/0133748 | A1* | 5/2018 | Fujiwara | B08B 3/08 |
| 2019/0011734 | A1* | 1/2019 | Otsuji | G02F 1/1333 |
| 2019/0091733 | A1* | 3/2019 | Iwao | H01L 21/67051 |
| 2019/0148129 | A1* | 5/2019 | Namba | H01L 21/67051 156/345.23 |
| 2019/0279885 | A1* | 9/2019 | Nakai | B05D 3/04 |
| 2019/0295865 | A1* | 9/2019 | Hanawa | H01L 21/67075 |
| 2019/0385835 | A1* | 12/2019 | Kobayashi | H01L 21/67034 |
| 2020/0126822 | A1* | 4/2020 | Kanematsu | B08B 3/041 |
| 2020/0381246 | A1* | 12/2020 | Nakai | H01L 21/02057 |

* cited by examiner

FIG. 8A
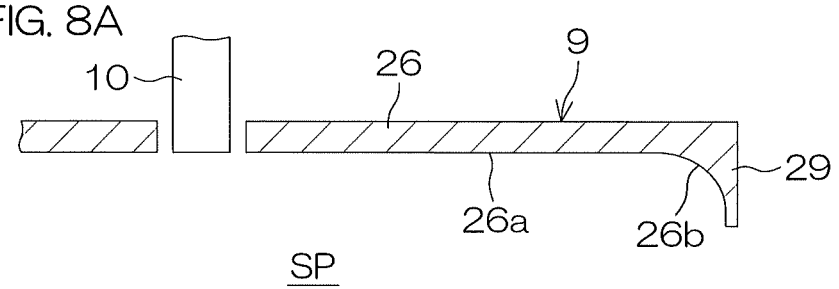
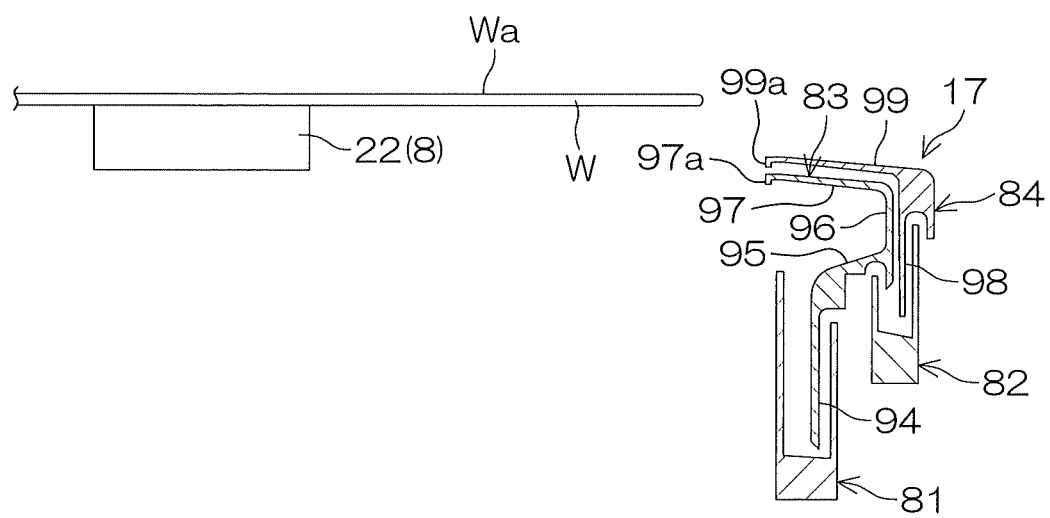
FIG. 8B
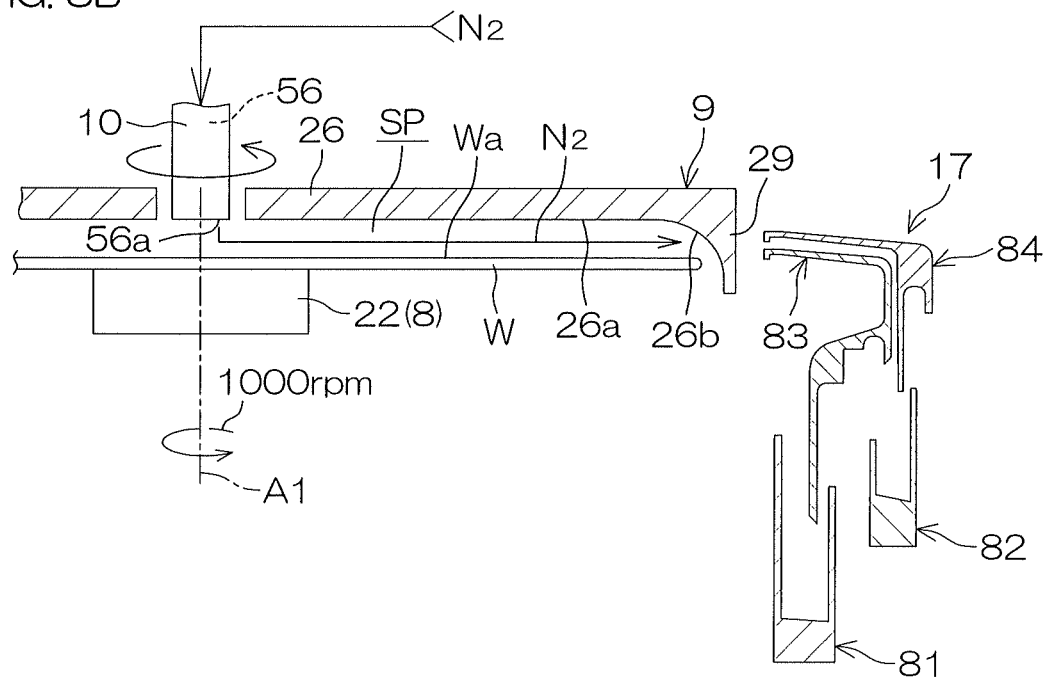

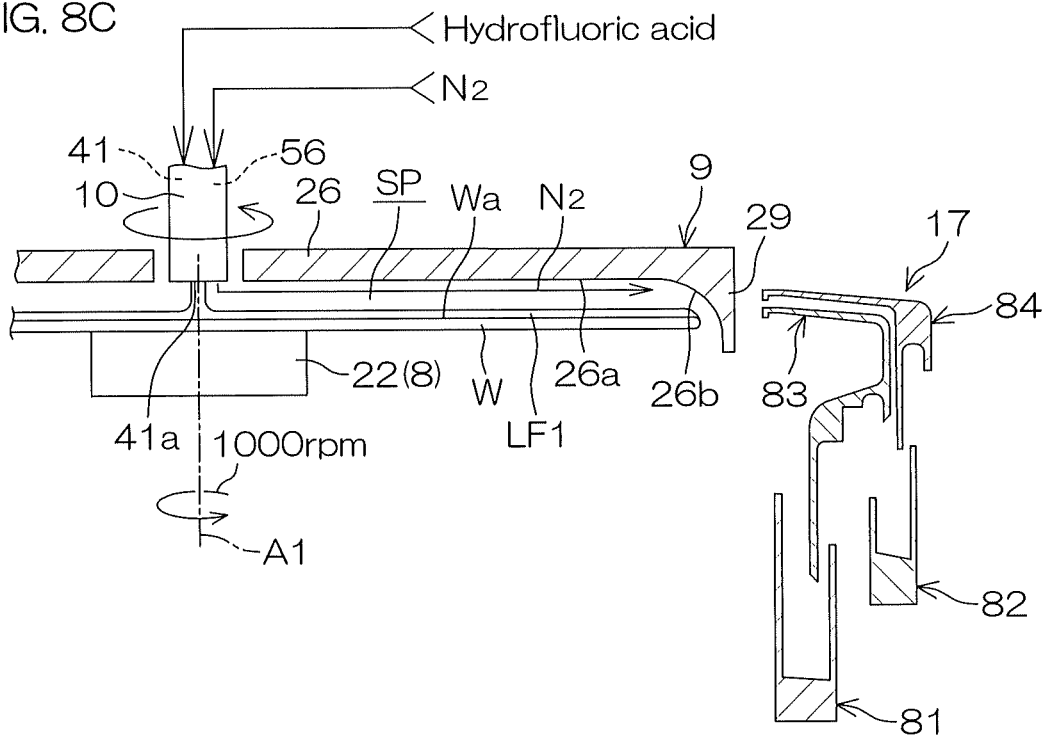
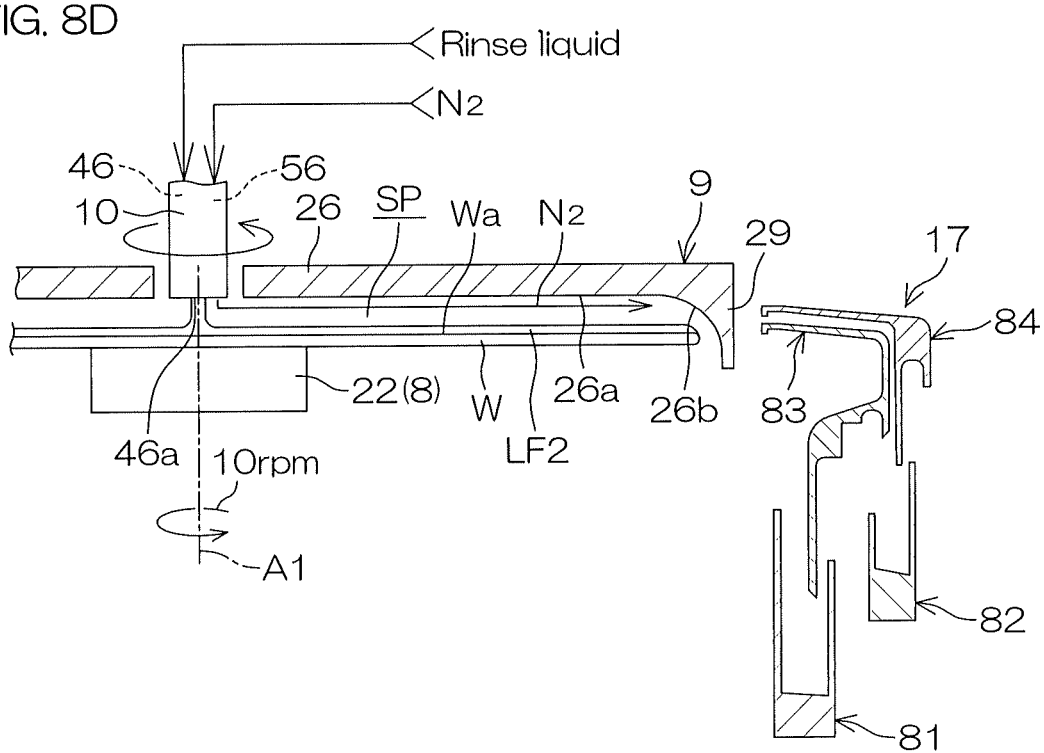

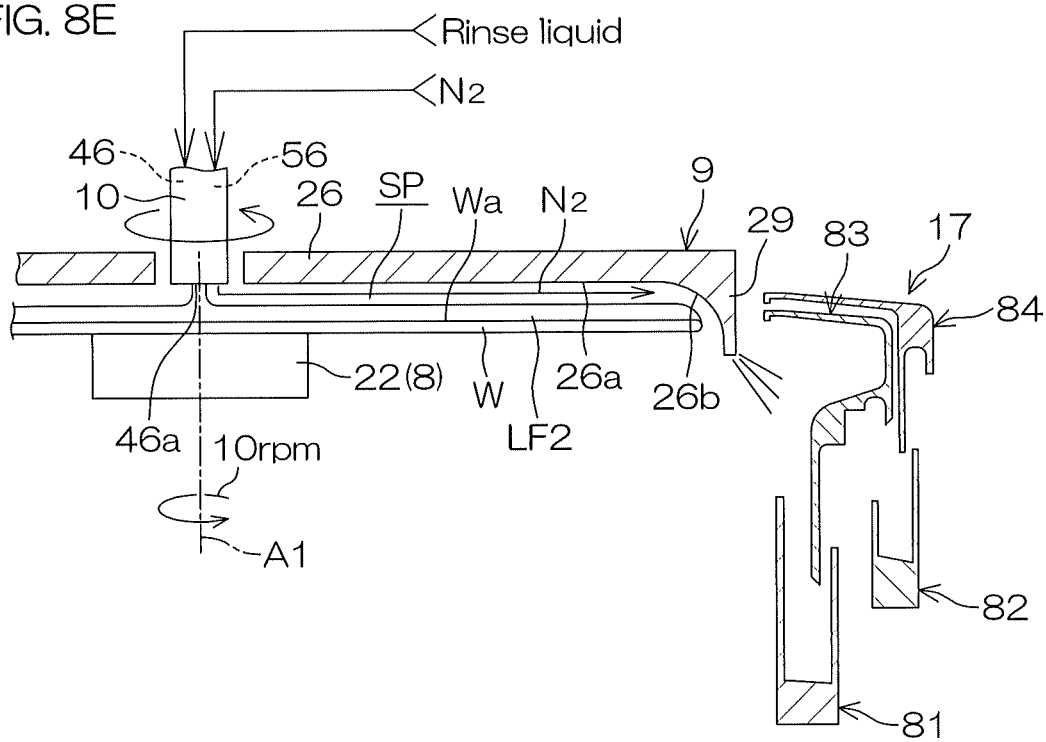
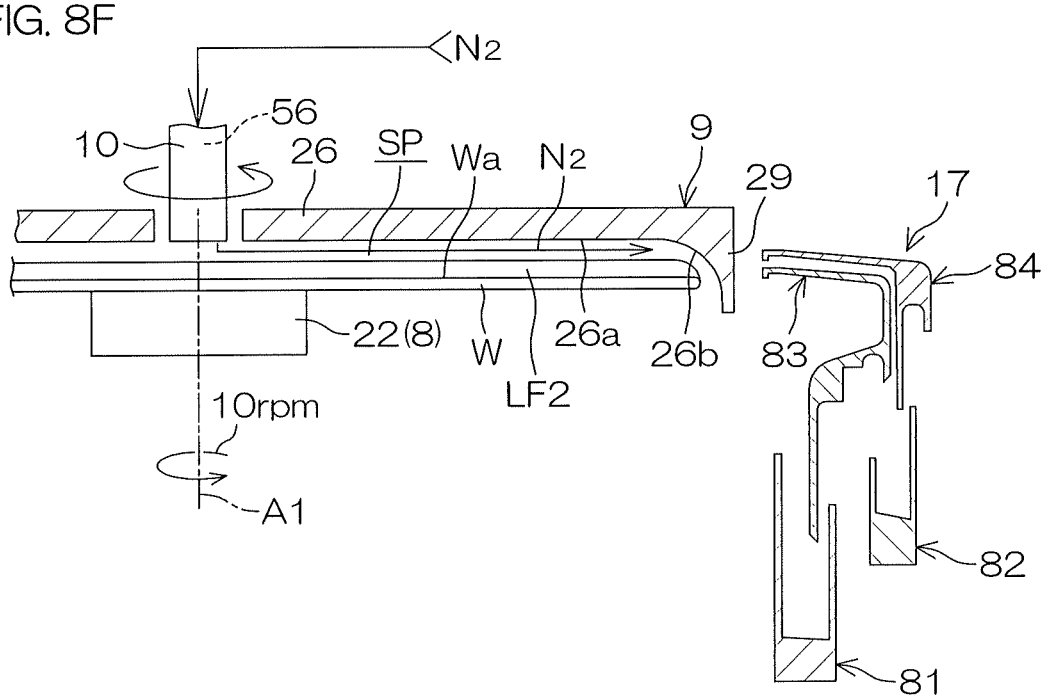

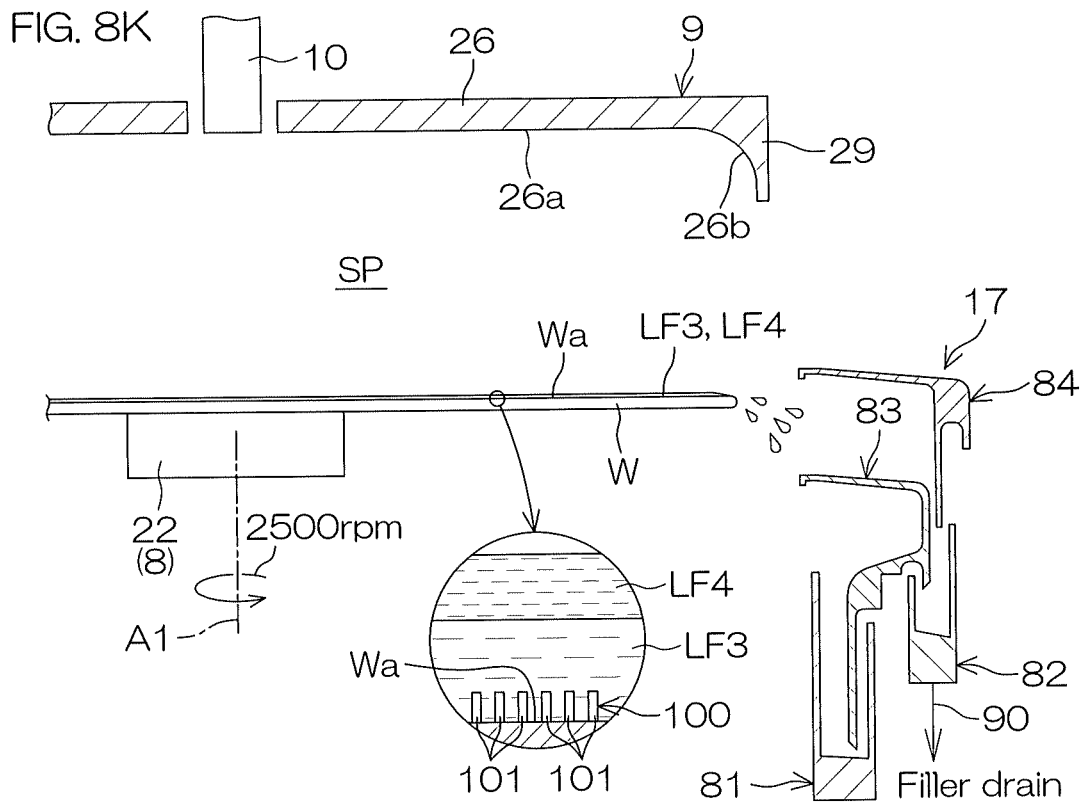
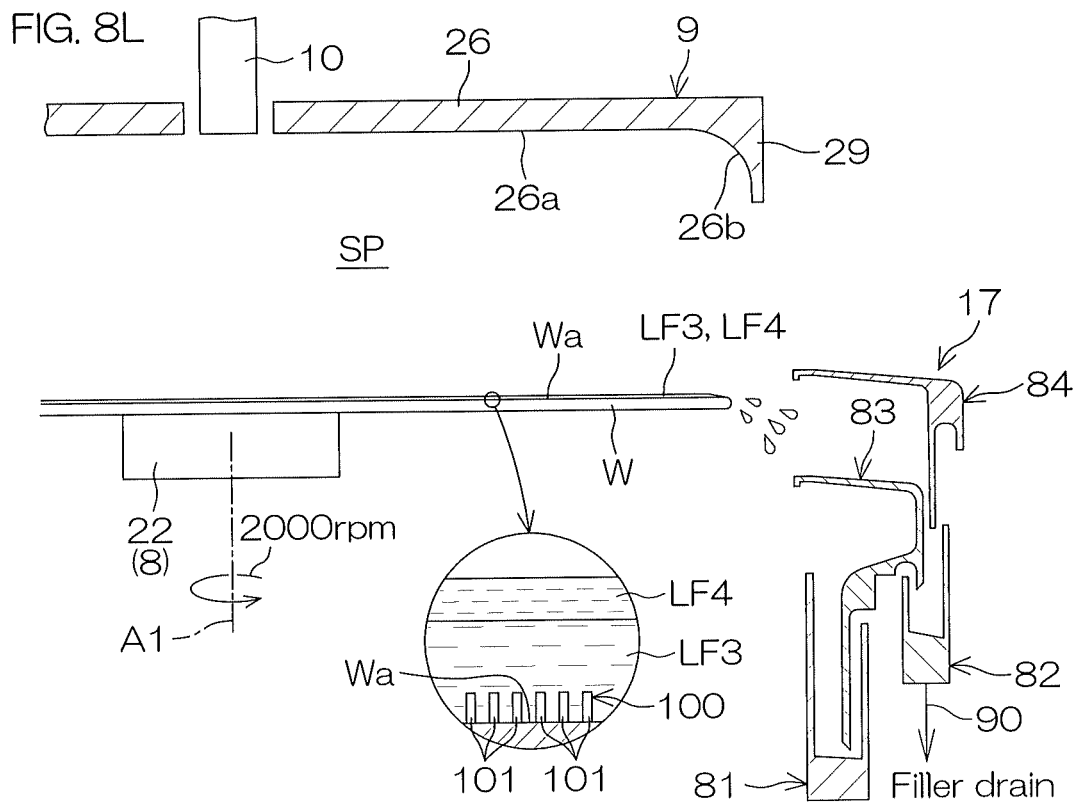

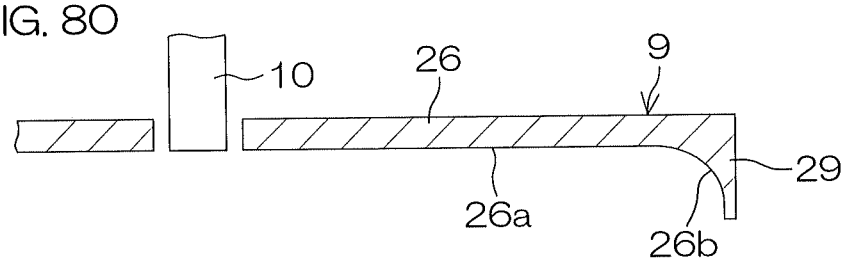
FIG. 80
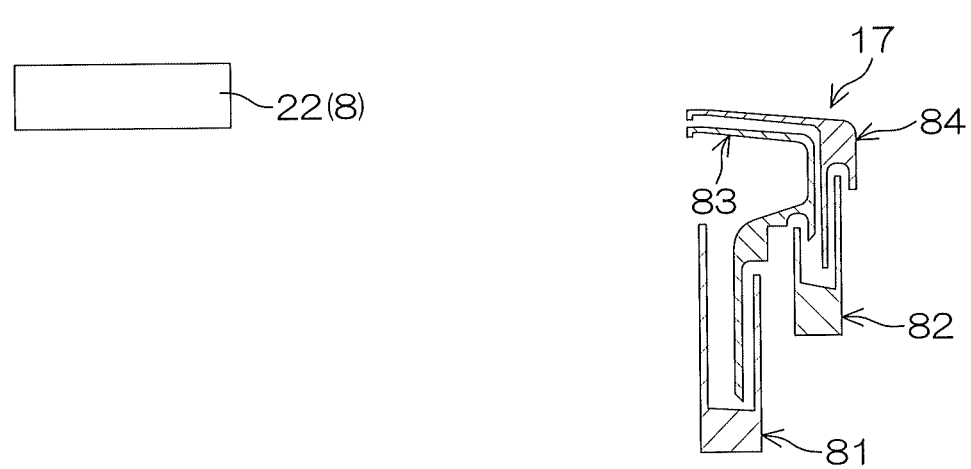

SUBSTRATE PROCESSING METHOD AND SUBSTRATE PROCESSING APPARATUS

CROSS REFERENCE TO RELATED APPLICATIONS

This application claims the benefit of priority to Japanese Patent Application No. 2019-103277 filed on May 31, 2019. The entire contents of this application are hereby incorporated herein by reference.

BACKGROUND OF THE INVENTION

1. Field of the Invention

The present invention relates to a substrate processing method and a substrate processing apparatus. Examples of substrates to be processed include semiconductor wafers, substrates for liquid crystal display devices, substrates for FPDs (flat panel displays), such as organic EL (electroluminescence) display devices, etc., substrates for optical disks, substrates for magnetic disks, substrates for magneto-optical disks, substrates for photomasks, ceramic substrates, substrates for solar cells, etc.

2. Description of the Related Art

A drying method in which a pattern forming surface of a substrate that has been processed with a liquid is covered with a solidified film of a filler (polymer) and the solidified film of the filler is removed (sublimated, etc.) using an ashing apparatus, etc., to dry the pattern forming surface is described in United States Patent Application Publication No. 2018/085780. Specifically, after the pattern forming surface of the substrate is processed using processing liquids (chemical liquid, rinse liquid), the filler that is a liquid is supplied to the pattern forming surface to cover the pattern forming surface with a liquid film of the filler. The filler is thereby filled between a plurality of patterns formed on the pattern forming surface.

By then solidifying the liquid film of the filler by heating, etc., of the substrate, the solidified film (coating film) of the filler that covers the pattern forming surface is formed. Thereafter, by removing the solidified film of the filler using the ashing apparatus, etc., the filler is removed from the pattern forming surface of the substrate. The pattern forming surface can be dried without emergence of an interface of a liquid between the patterns formed on the pattern forming surface and therefore pattern collapse can be suppressed.

SUMMARY OF THE INVENTION

There are cases where the patterns formed on the pattern forming surface become embrittled as the pattern forming surface becomes oxidized. Consequently, pattern collapse may also occur. Oxidation of the pattern forming surface must thus be suppressed or prevented.

With the method of US Patent Application Publication No. 2018/085780, although after the pattern forming surface is covered with the solidified film of the filler, the solidified film can prevent the oxidation of the pattern forming surface, before the solidified film of the filler is formed on the pattern forming surface, oxygen concentration in the ambient atmosphere will be high. That is, it may not be possible to suppress or prevent the oxidation of the pattern forming surface before forming of the solidified film.

Also, to form a satisfactory solidified film, it is desirable to supply the filler smoothly to the pattern forming surface of the substrate.

It is thus required to be able to suppress or prevent the oxidation of the pattern forming surface before the forming of the solidified film and to supply the filler smoothly to the pattern forming surface of the substrate.

Thus, an object of the present invention is to provide a substrate processing method and a substrate processing apparatus by which oxidation of a pattern forming surface before forming of a solidified film can be suppressed or prevented and a filler can be supplied smoothly to the pattern forming surface.

The present invention provides a substrate processing method including a substrate holding step of making a substrate holding unit hold a substrate in a state where a pattern forming surface on which patterns are formed is faced upward, a chemical liquid processing step of maintaining, on the pattern forming surface, a liquid film of a chemical liquid that covers the pattern forming surface, and processing the pattern forming surface by using the chemical liquid contained in the liquid film of the chemical liquid, an intermediate processing step of maintaining, on the pattern forming surface, a liquid film of an intermediate processing liquid that covers the pattern forming surface, and processing the pattern forming surface by using the intermediate processing liquid contained in the liquid film of the intermediate processing liquid after the chemical liquid processing step, a filler discharging step of discharging a filler being a liquid for filling between the patterns toward the pattern forming surface after the intermediate processing step, a filler spreading step of rotating the substrate around a vertical rotational axis to spread the filler supplied to the pattern forming surface toward an outer periphery of the substrate, a solidified film forming step of solidifying the filler supplied to the pattern forming surface to form a solidified film of the filler on the pattern forming surface, a lower position disposing step of making a blocking member having a disk portion that has a substrate facing surface facing the substrate from above and a circular cylindrical portion that extends downward from an outer peripheral portion of the disk portion be disposed at a lower position of blocking a space above the pattern forming surface from an atmosphere of an external space of the space and thereafter keeping the blocking member at the lower position prior to start of the chemical liquid processing step, and a blocking member elevating step of starting elevation of the blocking member toward an upper position positioned higher than the lower position in a state where the pattern forming surface of the substrate held by the substrate holding unit is covered with the liquid film of the intermediate processing liquid prior to start of the filler spreading step, and where the chemical liquid processing step includes a step of discharging the chemical liquid toward the pattern forming surface from a central nozzle that has a central portion discharge port facing a central portion of the pattern forming surface and is coupled to the disk portion and the filler spreading step includes a step of starting the spreading of the filler on the pattern forming surface in a state where the blocking member is positioned at the upper position.

According to the present method, the blocking member is provided with the circular cylindrical portion and therefore, in a state where the blocking member is positioned at the lower position, an atmosphere of the space above the pattern forming surface (hereinafter referred to as the "internal space") and an atmosphere of the external space outside the internal space can be substantially blocked from each other.

In this case, an interval between the substrate and the blocking member positioned at the lower position can be maintained in a state of low oxygen concentration.

Then, with the blocking member being positioned at the lower position, the chemical liquid processing by using the chemical liquid is performed. By starting the chemical liquid processing using the chemical liquid after sufficiently decreasing the oxygen concentration in the internal space, the chemical liquid processing using the chemical liquid can be applied to the pattern forming surface under an atmosphere of low oxygen concentration. Oxidation of the pattern forming surface in the chemical liquid processing can thereby be suppressed or prevented.

Also, by the filler being discharged toward the pattern forming surface, the filler is supplied to the pattern forming surface and a liquid film of the filler is formed on the pattern forming surface. Thereafter, the solidified film of the filler is formed by the liquid film of the filler being solidified.

If, for instance, the spreading of the filler on the pattern forming surface is started in the state where the blocking member is positioned at the lower position, the filler that splashes from a peripheral edge portion of the substrate upon receiving a centrifugal force due to rotation of the substrate may hit (collide against) the circular cylindrical portion of the blocking member and be resupplied to the pattern forming surface. If the filler is resupplied to the pattern forming surface, turbulence may arise in the filler present on the pattern forming surface. In this case, a defect may arise in the substrate after removal of the solidified film.

On the other hand, with the present preferred embodiment, the spreading of the filler on the pattern forming surface is started in the state where the blocking member is positioned at the upper position. The blocking member is positioned at the upper position and therefore, the filler that splashes from the peripheral edge portion of the substrate can be suppressed or prevented from hitting the circular cylindrical portion of the blocking member and being resupplied to the pattern forming surface. Arising of turbulence in the filler present on the pattern forming surface can thus be suppressed or prevented. Arising of a defect in the substrate after removal of the solidified film can thereby be suppressed.

Also, with the present method, the elevation of the blocking member is started in the state where the pattern forming surface is covered with the liquid film of the intermediate processing liquid. That is, a blocked state of the internal space is released while protecting the pattern forming surface by the liquid film of the intermediate processing liquid. The pattern forming surface is protected by the liquid film even after the release of the blocked state. The oxidation of the pattern forming surface in accompaniment with the release of the blocked state of the internal space can thus be suppressed or prevented reliably.

By the above, the oxidation of the pattern forming surface before the forming of the solidified film can be suppressed or prevented and the filler can be supplied smoothly to the pattern forming surface.

In the preferred embodiment of the present invention, in the state where the blocking member is positioned at the upper position, a lower end of the circular cylindrical portion is positioned higher than an upper end of a processing cup that surrounds the substrate holding unit.

According to the present method, the lower end of the circular cylindrical portion is positioned higher than the upper end of the processing cup in the state where the blocking member is positioned at the upper position.

Normally, a height position of the upper end of the processing cup is a position enabling capture of liquid splashing from the substrate by the processing cup. Therefore, with the configuration where the lower end of the circular cylindrical portion is positioned higher than the upper end of the processing cup in the state where the blocking member is positioned at the upper position, the processing liquid expelled from the peripheral edge portion of the substrate can be suppressed more effectively from hitting the circular cylindrical portion and being resupplied to the pattern forming surface.

In the preferred embodiment of the present invention, the blocking member elevating step includes a step of starting the elevation of the blocking member toward the upper position in the state where the pattern forming surface of the substrate held by the substrate holding unit is covered with the liquid film of the intermediate processing liquid prior to start of the filler discharging step. Also, the filler discharging step includes a step of starting discharge of the filler to the pattern forming surface in the state where the blocking member is positioned at the upper position.

According to the present method, the filler supplied to the pattern forming surface can be suppressed more effectively from hitting the cylindrical portion of the blocking member because the blocking member is positioned at the upper position. The arising of turbulence in the filler present on the pattern forming surface can thereby be suppressed more effectively.

In the preferred embodiment of the present invention, the filler discharging step includes a step of not discharging the filler from the central nozzle but discharging the filler toward the pattern forming surface from a filler nozzle that is a filler nozzle provided separately of the central nozzle, being movable along the pattern forming surface, and being housed between the substrate held by the substrate holding unit and the blocking member positioned at the upper position.

According to the present method, in the filler discharging step, the filler nozzle is disposed between the substrate and the blocking member positioned at the upper position. Also, the filler is discharged toward the pattern forming surface not from the central nozzle but from the filler nozzle. At this time, a distance in a vertical direction between the pattern forming surface and a discharge port of the filler nozzle is shorter than a distance in the vertical direction between the central portion discharge port of the central nozzle and the pattern forming surface in the chemical liquid processing step.

As a distance in the vertical direction between a discharge port and the pattern forming surface increases, time until the filler discharged from the discharge port reaches the pattern forming surface increases. Therefore, if the distance in the vertical direction between the discharge port and the pattern forming surface is long, a liquid stream of the discharged filler is easily influenced by external disturbance. Therefore, if, for instance, the filler is discharged toward the pattern forming surface from the central portion discharge port of the blocking member positioned at the upper position in the filler discharging step, it is sometimes difficult to make the filler land on an intended liquid landing position of the pattern forming surface at an intended liquid landing flow rate. In this case, it may not be possible to supply (coat) the pattern forming surface with the filler satisfactorily.

On the other hand, with the present method, the filler is discharged toward the pattern forming surface from the discharge port of the filler nozzle that is close in distance in the vertical direction with respect to the pattern forming surface. The filler can thus be made to land on the intended liquid landing position of the pattern forming surface at the intended liquid landing flow rate. The pattern forming surface can thereby be supplied (coated) with the filler satisfactorily. A satisfactory solidified film can thus be formed on the pattern forming surface.

In this case, preferably, the distance in the vertical direction between the discharge port of the filler nozzle and the pattern forming surface in the filler discharging step is the same as the distance in the vertical direction between the central portion discharge port and the pattern forming surface in the state where the blocking member is positioned at the lower position or is shorter than this distance.

According to the present method, a height position of the discharge port of the filler nozzle in the filler discharging step is the same as a height position of the central portion discharge port in the state where the blocking member is positioned at the lower position or is lower than this height position.

Normally, the central portion discharge port in the state where the blocking member is positioned at the lower position is positioned at a height position at which the liquid discharged from the central portion discharge port can be made to land satisfactorily on the intended liquid landing position of the pattern forming surface without the liquid being influenced by external disturbance. Therefore, by disposing the discharge port of the filler nozzle at the same position as the height position of the central portion discharge port when the blocking member is positioned at the lower position or a lower position in the filler discharging step, the filler discharged from the discharge port of the filler nozzle can be suppressed effectively from being influenced by external disturbance.

In the preferred embodiment of the present invention, the chemical liquid processing step includes a chemical liquid supplying step of supplying the chemical liquid to the pattern forming surface. Also, the intermediate processing step includes an intermediate processing liquid supplying step of supplying the intermediate processing liquid to the pattern forming surface. Further, a discharge flow rate of the filler from the filler nozzle in the filler discharging step is less than a supply flow rate of the chemical liquid to the pattern forming surface in the chemical liquid supplying step and less than a supply flow rate of the intermediate processing liquid to the pattern forming surface in the intermediate processing liquid supplying step.

According to the present method, the discharge flow rate of the filler from the filler nozzle in the filler discharging step is low. Therefore, if, for instance, the filler is discharged not from the filler nozzle but from the central portion discharge port, the filler supplied to the pattern forming surface may not be of a continuous flow but may be intermittent or the filler may land on a position deviated from the intended liquid landing position.

On the other hand, with the present method, the distance in the vertical direction between the discharge port of the filler nozzle and the pattern forming surface is short and therefore, even when the discharge flow rate of the filler from the filler nozzle is low, the filler supplied to the pattern forming surface can be kept in a continuous flow and the filler can be made to land with good precision on the intended liquid landing position of the pattern forming surface. The filler can thereby be supplied to the pattern forming surface even more satisfactorily.

In the preferred embodiment of the present invention, the filler spreading step includes a high speed rotation step of rotating the substrate at a faster speed than in the chemical liquid processing step and in the intermediate processing step.

According to the present method, a strong air stream may be generated between the substrate and the blocking member due to high speed rotation of the substrate. The distance in the vertical direction between the discharge port of the filler nozzle and the pattern forming surface is short and therefore, even when a strong air stream is generated in the internal space, influence of the air stream on the filler discharged from the filler nozzle can be suppressed to a minimum. The filler can thus be made to land with good precision on the intended liquid landing position of the pattern forming surface. The filler can thereby be supplied to the pattern forming surface even more satisfactorily.

In the preferred embodiment of the present invention, the substrate processing method further includes a filler settling step of making the filler that is spread across an entirety of the pattern forming surface settle after the filler spreading step.

According to the present method, the filler can be filled between the patterns across the entirety of the pattern forming surface.

In the preferred embodiment of the present invention, the intermediate processing step includes a solvent processing step of maintaining, on the pattern forming surface, a liquid film of a solvent that covers the pattern forming surface and processing the pattern forming surface using the solvent contained in the liquid film of the solvent.

Depending on its type, the filler may not have solubility (miscibility) with respect to a rinse liquid that is supplied to the pattern forming surface after the chemical liquid processing step. In this case, by replacing a liquid film of the rinse liquid, etc., covering the pattern forming surface with a solvent such that has solubility (miscibility) with respect to the filler as the intermediate processing step, the steps from the filler discharging step onward can be executed smoothly.

Further, with the present method, the blocked state of the internal space is released in the state where the pattern forming surface is covered with the liquid film of the solvent. Since the blocked state of the internal space is released while protecting the pattern forming surface with the liquid film of the solvent, the filler can be discharged onto the pattern forming surface while suppressing or preventing the oxidation of the pattern forming surface reliably.

In the preferred embodiment of the present invention, the solvent processing step includes a step of discharging the solvent toward the pattern forming surface from at least one of either of the central nozzle and/or a solvent nozzle that is provided separately of the central nozzle and is movable along the pattern forming surface.

According to the present method, the solvent is discharged toward the pattern forming surface from at least one of either of the central nozzle and the solvent nozzle. The liquid film of the solvent that covers the pattern forming surface can thereby be supplied satisfactorily.

In the preferred embodiment of the present invention, the solvent processing step includes a central discharging step of discharging the solvent toward the pattern forming surface from the central nozzle. Also, the substrate processing method further includes an intermediate position disposing step of disposing the blocking member from the lower position to an intermediate position set between the lower position and the upper position and at which the lower end of the circular cylindrical portion is positioned at the same height as the upper end of the processing cup surrounding the substrate holding unit in a middle of the central discharging step.

According to the present method, by the intermediate processing liquid being supplied in the state where the blocking member is positioned at the lower position, the intermediate processing liquid sometimes becomes attached to the circular cylindrical portion. By rotating the blocking member positioned at the intermediate position at high speed, the intermediate processing liquid attached to the circular cylindrical portion can be removed to dry the circular cylindrical portion.

Also, the upper end of the processing cup is set at the same height as the lower end of the circular cylindrical portion of the blocking member positioned at the intermediate position. The intermediate processing liquid that is spun off from the circular cylindrical portion by rotation of the blocking member can thus be captured satisfactorily by the processing cup.

In the preferred embodiment of the present invention, the substrate processing method further includes an inert gas supplying step of discharging an inert gas downward from an inert gas discharge port that is opened at the substrate facing surface of the blocking member from before the start of the chemical liquid processing step.

According to the present method, the inert gas is discharged downward from the inert gas discharge port that is opened at the substrate facing surface of the blocking member. The inert gas discharged from the inert gas discharge port spreads in the internal space between the pattern forming surface of the substrate and the substrate facing surface of the blocking member. By the internal space thereby being filled with the inert gas, the oxygen concentration in the atmosphere of the internal space can be reduced further. By then applying the chemical liquid processing to the pattern forming surface in the internal space after the oxygen concentration has decreased sufficiently, the oxidation of the pattern forming surface before the forming of the solidified film can be suppressed or prevented more effectively before the forming of the solidified film.

In the preferred embodiment of the present invention, the chemical liquid contained in the liquid film of the chemical liquid in the chemical liquid processing step is a chemical liquid that is reduced in dissolved oxygen amount (low in dissolved oxygen concentration).

According to the present method, the pattern forming surface can be processed using the chemical liquid that is reduced in dissolved oxygen amount. The pattern forming surface can thereby be suppressed or prevented from being oxidized by the oxygen dissolved in the chemical liquid. The oxidation of the pattern forming surface before the forming of the solidified film can thereby be suppressed or prevented more effectively.

In the preferred embodiment of the present invention, the chemical liquid contained in the liquid film of the chemical liquid in the chemical liquid processing step contains hydrofluoric acid.

When the pattern forming surface is oxidized, an oxide film is formed on the pattern forming surface. If hydrofluoric acid is contained in the chemical liquid used in the chemical liquid processing step, the oxide film is removed from the pattern forming surface in the chemical liquid processing step. Consequently, the pattern forming surface may degenerate in the chemical liquid processing step.

However, with the present method, the chemical liquid processing using the chemical liquid is performed with the blocking member having the circular cylindrical portion being positioned at the lower position. By starting the chemical liquid processing using the chemical liquid after the oxygen concentration in the internal space has been decreased sufficiently, the chemical liquid processing using the chemical liquid can be applied to the pattern forming surface under an atmosphere of low oxygen concentration. The oxidation of the pattern forming surface in the chemical liquid processing can thereby be suppressed or prevented.

In the preferred embodiment of the present invention, the substrate processing method further includes a solidified film forming step of heating the substrate to solidify the filler contained in the liquid film of the filler formed on the pattern forming surface to form the solidified film of the filler on the pattern forming surface.

According to the present method, the filler contained in the liquid film of the filler is solidified by heating the substrate held by the substrate holding unit. The solidified film of the filler is thereby formed on the pattern forming surface. That is, the forming of the liquid film of the filler and the solidifying of the liquid film of the filler are performed while making the substrate holding unit in common hold the substrate. There is thus no need to transfer the substrate among a plurality of chambers and improvement of throughput of processing can thus be achieved.

In the preferred embodiment of the present invention, the substrate processing method further includes a filler removing step of heating the substrate to sublimate the filler contained in the solidified film of the filler formed on the pattern forming surface to remove the filler from the pattern forming surface.

According to the present method, the filler contained in the liquid film contained in the solidified film of the filler is sublimated by heating the substrate held by the substrate holding unit. The filler is thereby removed from the pattern forming surface. That is, the forming of the liquid film of the filler and the sublimation of the solidified film of the filler are performed while making the substrate holding unit in common hold the substrate. The forming of the liquid film of the filler on the pattern forming surface, the solidifying of the liquid film of the filler, and the removal of the filler from the pattern forming surface can thus be performed with a single apparatus. The improvement of the throughput of processing can thus be achieved even further.

Also, the present invention provides a substrate processing apparatus including a substrate holding unit that holds a substrate horizontally in a state where a pattern forming surface on which patterns are formed is faced upward, a substrate rotating unit that is configured to rotate the substrate held by the substrate holding unit around a vertical rotational axis, a chemical liquid supplying unit that is configured to supply a chemical liquid to the pattern forming surface of the substrate held by the substrate holding unit, an intermediate processing liquid supplying unit that is configured to supply an intermediate processing liquid to the pattern forming surface of the substrate held by the substrate holding unit, a filler nozzle that is configured to discharge a filler being a liquid for filling between the patterns toward the pattern forming surface of the substrate held by the substrate holding unit, a filler supplying unit that is configured to supply the filler to the filler nozzle, a filler solidifying unit that is configured to solidify the filler supplied to the pattern forming surface of the substrate held by the substrate holding unit, a blocking member that has a disk portion having a substrate facing surface facing the substrate held by the substrate holding unit from above and a circular cylindrical portion extending downward from an outer peripheral portion of the disk portion, a blocking member elevating/ lowering unit that elevates and lowers the blocking member between a lower position of blocking a space above the pattern forming surface from an atmosphere of an external space outside the space and an upper position positioned higher than the lower position, a central nozzle that has a central portion discharge port facing a central portion of the pattern forming surface, is coupled to the disk portion, and is supplied with the chemical liquid from the chemical liquid supplying unit, and a controller that controls the chemical liquid supplying unit, the intermediate processing liquid supplying unit, the filler supplying unit, and the blocking member elevating/lowering unit. The controller is programmed to execute a chemical liquid processing step in which the chemical liquid supplying unit makes the chemical liquid be discharged from the central portion discharge port toward the pattern forming surface of the substrate held by the substrate holding unit to form a liquid film of the chemical liquid that covers the pattern forming surface and maintain the liquid film of the chemical liquid on the pattern forming surface to process the pattern forming surface using the chemical liquid contained in the liquid film of the chemical liquid, an intermediate processing step of maintaining, on the pattern forming surface, a liquid film of the intermediate processing liquid that is formed by the intermediate processing liquid supplying unit and covers the pattern forming surface and processing the pattern forming surface using the intermediate processing liquid contained in the liquid film of the intermediate processing liquid after the chemical liquid processing step, a filler discharging step in which the filler supplying unit makes the filler be discharged from the filler nozzle toward the pattern forming surface after the intermediate processing step, a filler spreading step of rotating the substrate around the rotational axis by the substrate rotating unit to spread the filler supplied to the pattern forming surface toward an outer periphery of the substrate, a solidified film forming step of making the filler supplied to the pattern forming surface be solidified by the filler solidifying unit to form a solidified film of the filler on the pattern forming surface, a lower position disposing step of disposing the blocking member at the lower position by the blocking member elevating/lowering unit and thereafter keeping the blocking member at the lower position prior to start of the chemical liquid processing step, and a blocking member elevating step of starting elevation of the blocking member from the lower position toward the upper position in a state where the pattern forming surface of the substrate is covered with the liquid film of the intermediate processing liquid prior to start of the filler spreading step. Also, the filler spreading step includes a step of starting the spreading of the filler on the pattern forming surface in a state where the blocking member is positioned at the upper position.

According to the present arrangement, the blocking member is provided with the circular cylindrical portion and therefore, in a state where the blocking member is positioned at the lower position, an atmosphere of the space above the pattern forming surface (hereinafter referred to as the "internal space") and an atmosphere of the external space outside the internal space can be substantially blocked from each other. In this case, an interval between the substrate and the blocking member positioned at the lower position can be maintained in a state of low oxygen concentration.

Then, with the blocking member being positioned at the lower position, the chemical liquid processing using the chemical liquid is performed. By starting the chemical liquid processing using the chemical liquid after sufficiently decreasing the oxygen concentration in the internal space, the chemical liquid processing using the chemical liquid can be applied to the pattern forming surface under an atmosphere of low oxygen concentration. Oxidation of the pattern forming surface in the chemical liquid processing can thereby be suppressed or prevented.

Also, by the filler being discharged toward the pattern forming surface, the filler is supplied to the pattern forming surface and a liquid film of the filler is formed on the pattern forming surface. Thereafter, the solidified film of the filler is formed by the liquid film of the filler being solidified.

If, for instance, the spreading of the filler on the pattern forming surface is started in the state where the blocking member is positioned at the lower position, the filler that splashes from a peripheral edge portion of the substrate upon receiving a centrifugal force due to rotation of the substrate may hit (collide against) the circular cylindrical portion of the blocking member and be resupplied to the pattern forming surface. If the filler is resupplied to the pattern forming surface, turbulence may arise in the filler present on the pattern forming surface. In this case, a defect may arise in the substrate after removal of the solidified film.

On the other hand, with the present preferred embodiment, the spreading of the filler on the pattern forming surface is started in the state where the blocking member is positioned at the upper position. In the state where the blocking member is positioned at the upper position, a lower end of the circular cylindrical portion is positioned higher than the pattern forming surface. Therefore, the filler that splashes from the peripheral edge portion of the substrate can be suppressed or prevented from hitting the circular cylindrical portion of the blocking member and being resupplied to the pattern forming surface. Arising of turbulence in the filler present on the pattern forming surface can thus be suppressed or prevented. Arising of a defect in the substrate after removal of the solidified film can thereby be suppressed.

Also, with the present configuration, the elevation of the blocking member is started in the state where the pattern forming surface is covered with the liquid film of the intermediate processing liquid. That is, a blocked state of the internal space is released while protecting the pattern forming surface by the liquid film of the intermediate processing liquid. The pattern forming surface is protected by the liquid film even after the release of the blocked state. The oxidation of the pattern forming surface in accompaniment with the release of the blocked state of the internal space can thus be suppressed or prevented reliably.

The above and other elements, features, steps, characteristics and advantages of the present invention will become more apparent from the following detailed description of the preferred embodiments with reference to the attached drawings.

In the preferred embodiment of the present invention, the chemical liquid supplying unit includes a dissolved oxygen reducing unit configured to reduce a dissolved oxygen amount in the chemical liquid.

According to the present configuration, the pattern forming surface can be processed using the chemical liquid that is reduced in dissolved oxygen amount. The pattern forming surface can thereby be suppressed or prevented from being oxidized by the oxygen dissolved in the chemical liquid. The oxidation of the pattern forming surface before the forming of the solidified film can thereby be suppressed or prevented more effectively.

In the preferred embodiment of the present invention, a heater configured such that the substrate held by the substrate holding unit is heated from an opposite side to the pattern forming surface is further included.

According to the present configuration, the substrate held by the substrate holding unit is heated by the heater. The filler contained in the liquid film of the filler can thereby be solidified. Consequently, the solidified film of the filler can be formed on the pattern forming surface. In this case, the forming of the liquid film of the filler and the solidifying of the liquid film of the filler are performed while making the substrate holding unit in common hold the substrate. There is thus no need to transfer the substrate among a plurality of chambers and improvement of throughput of processing can thus be achieved.

In the preferred embodiment of the present invention, the substrate processing apparatus further includes a surrounding member that surrounds the substrate holding unit. Also, an internal space demarcated by the blocking member positioned at the lower position and the surrounding member is sealed from an external space outside the internal space.

According to the present arrangement, in the state where the blocking member is positioned at the lower position, the internal space of the surrounding member is sealed from the external space outside the internal space. In this case, an atmosphere of the external space outside that contains much oxygen is suppressed from entering into the internal space of the surrounding member. A space between the blocking member and the substrate can thereby be maintained in a low oxygen atmosphere readily. The oxidation of the pattern forming surface can thus be suppressed or prevented more effectively.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
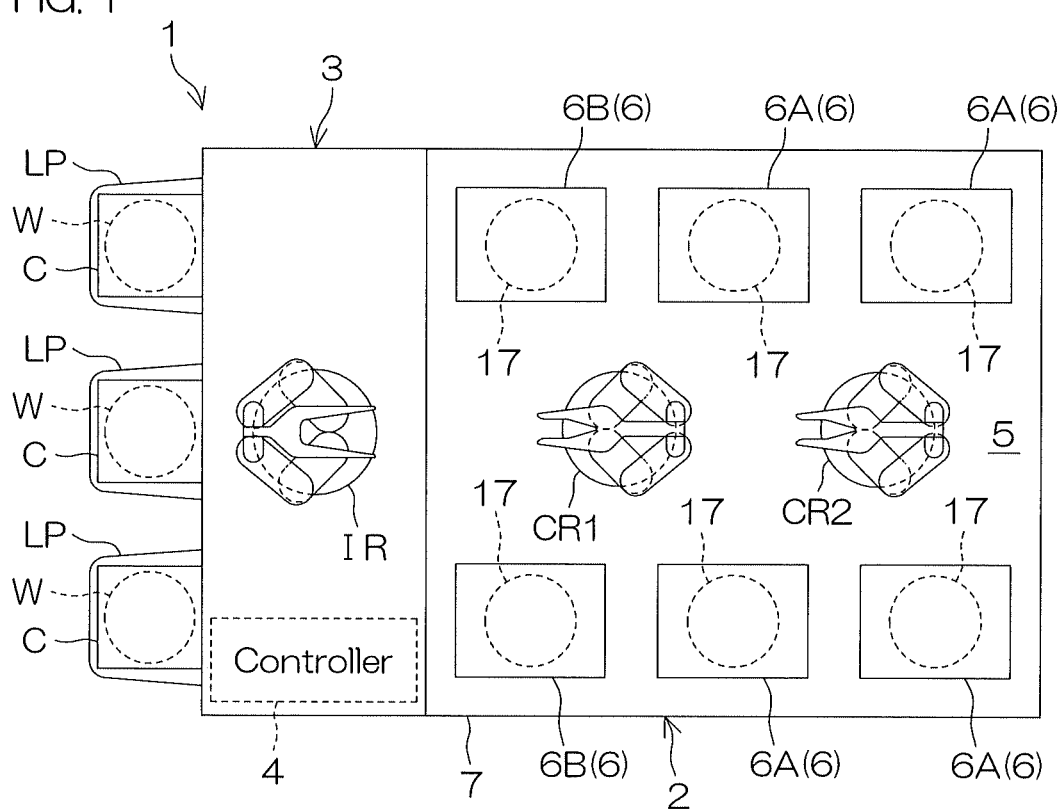
FIG. 1 is a schematic view of a substrate processing apparatus according to a first preferred embodiment of the present invention as viewed from above.

FIG. 1 is a schematic view of a substrate processing apparatus 1 according to a first preferred embodiment of the present invention as viewed from above.

The substrate processing apparatus 1 is a single substrate processing type apparatus that processes a disk-shaped substrate W, such as a silicon wafer, etc., one at a time. The substrate processing apparatus 1 includes an apparatus main body 2 disposed inside a clean room, an indexer unit 3 coupled to the apparatus main body 2, a processing liquid supplying apparatus, and a controller 4 controlling the substrate processing apparatus 1.

The indexer unit 3 includes a plurality of load ports LP each holding a plurality of substrate containers C that house substrates W and an indexer robot IR configured to transfer the substrates W to the respective substrate containers C.

The apparatus main body 2 includes a transfer chamber 5, processing units that process the substrates W transferred from the plurality of load ports LP with processing fluids, such as processing liquids, processing gases, etc. The plurality of processing units 6 form a plurality (for example, four) of towers respectively disposed at a plurality (for example, four) of positions that are separated horizontally. Each tower includes a plurality (for example, three) of the processing units 6 that are stacked vertically. Six towers are disposed three each at respective sides of the transfer chamber 5.

Besides the indexer robot IR, the substrate processing apparatus 1 includes a first transfer robot CR1 and a second transfer robot CR2 as transfer robots. The first transfer robot CR1 and the second transfer robot CR2 are disposed inside the transfer chamber 5. The indexer robot IR transfers the substrates W between the load ports LP and the first transfer robot CR1. The indexer robot IR includes a hand that supports a substrate W. The first transfer robot CR1 transfers the substrates W between the first transfer robot CR1 and the processing units 6 included in two towers at the load port LP side and transfers the substrates W between the indexer robot IR and the second transfer robot CR2. The second transfer robot CR2 transfers the substrates W between the indexer robot IR and the processing units 6 included in four towers at an opposite side to the load port LP side. The first transfer robot CR1 and the second transfer robot CR2 each includes a hand that supports a substrate W.

The plurality of processing units 6 include a liquid processing unit 6A that supplies processing liquids to a pattern forming surface (front surface) Wa of a substrate W to process the substrate W with the processing liquids and a baking unit (filler solidifying unit) 6B that heats a substrate W to apply a heating processing to the substrate W. In the example of FIG. 1, the processing units 6 included in the two towers at the load port LP side are liquid processing units 6B. In the example of FIG. 1, the processing units 6 included in the four towers at the opposite side to the load port LP side are baking units 6A.

Figure 2:
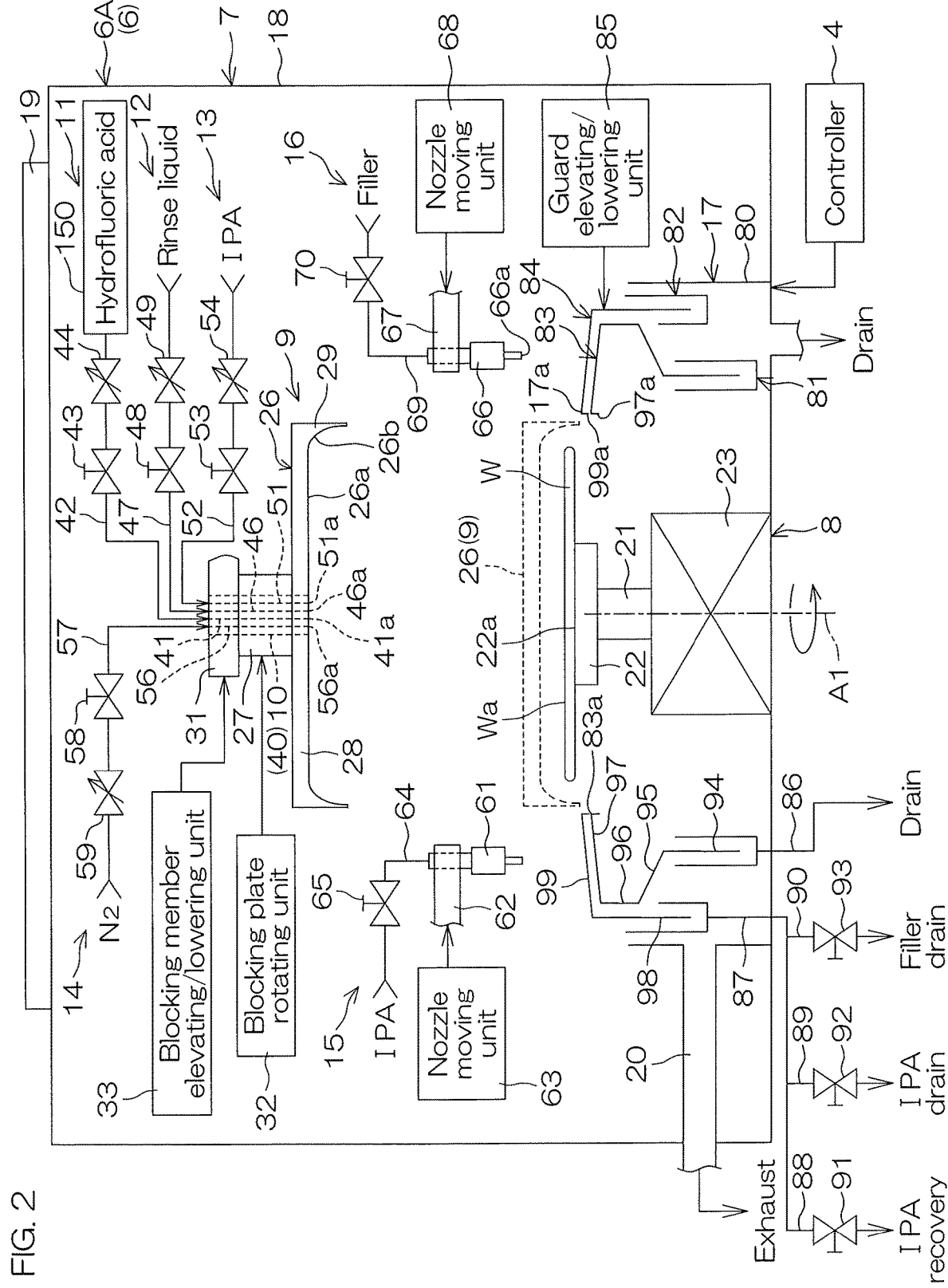
FIG. 2 is an illustrative view for describing a configuration example of a liquid processing unit included in the substrate processing apparatus.
Figure 3:
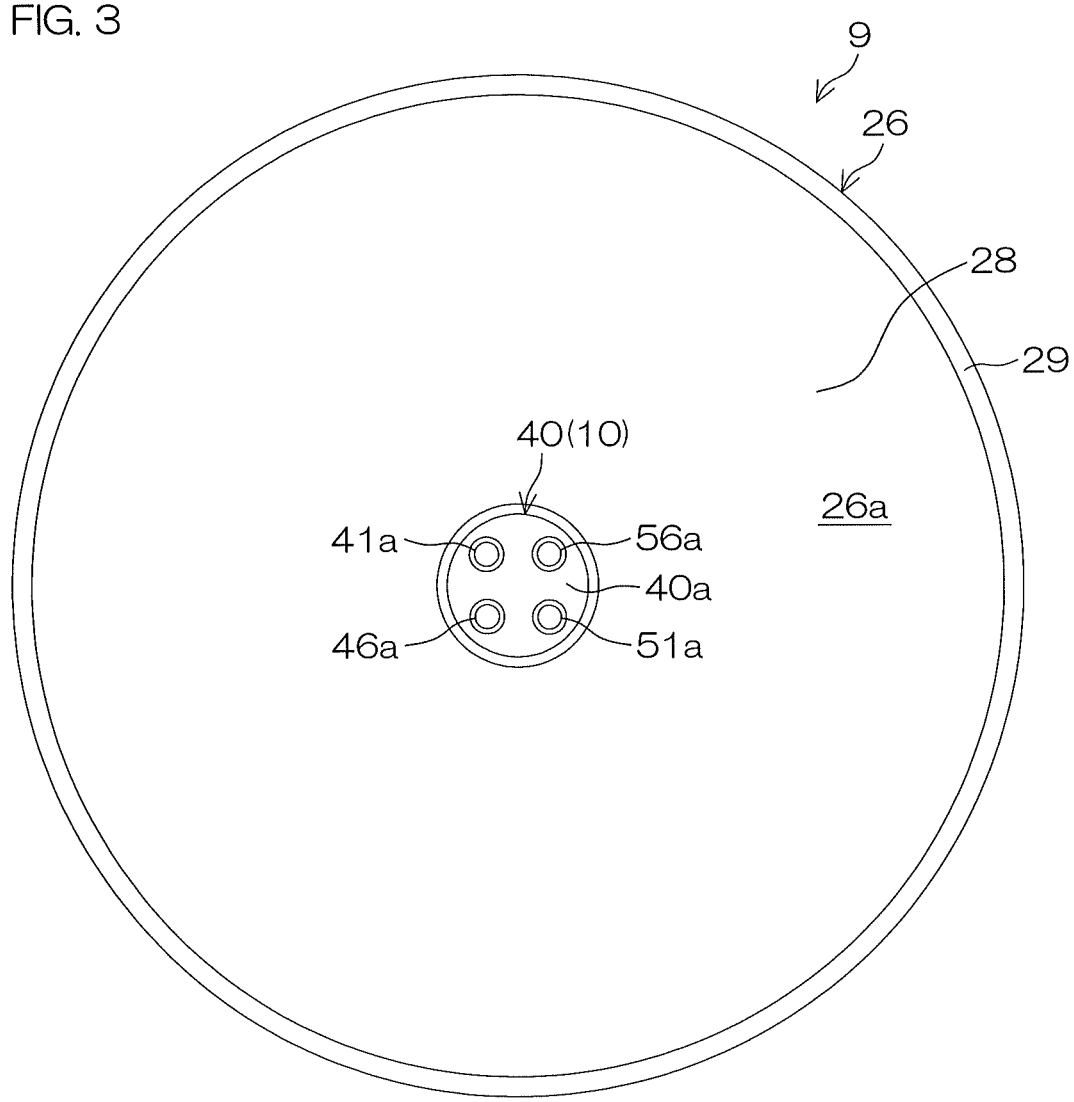
FIG. 3 is a bottom view of a blocking member included in the liquid processing unit.

FIG. 2 is an illustrative view for describing a configuration example of a liquid processing unit 6A included in the substrate processing apparatus 1. FIG. 3 is a bottom view of a blocking member 9.

The processing unit 6 includes a box-shaped chamber 7, a spin chuck (substrate holding unit) 8 holding a single substrate W in a horizontal orientation inside the chamber 7 and rotating the substrate W around a vertical rotational axis A1 passing through a center of the substrate W, a blocking member 9 blocking a space above the upper surface (pattern forming surface Wa (see FIG. 6)) of the substrate W held by the spin chuck 8 from an atmosphere of an external space of the space, a central nozzle 10 inserted vertically through an interior of the blocking member 9 and configured to discharge processing liquids toward a central portion of the upper surface of the substrate W held by the spin chuck 8, a chemical liquid supplying unit 11 supplying hydrofluoric acid as an example of a chemical liquid to the central nozzle 10, a rinse liquid supplying unit 12 supplying a rinse liquid to the central nozzle 10, a solvent medium supplying unit 13 supplying a solvent as an intermediate processing liquid to the central nozzle 10, an inert gas supplying unit 14 supplying an inert gas to the central nozzle 10, a solvent supplying unit (intermediate processing liquid supplying unit) 15 supplying the solvent as an example of the intermediate processing liquid to the central portion of the pattern forming surface Wa of the substrate W held by the spin chuck 8, a filler supplying unit 16 supplying a liquid filler to the central portion of the pattern forming surface Wa of the substrate W held by the spin chuck 8, and a cylindrical processing cup 17 surrounding lateral sides of the spin chuck 8.

The chamber 7 includes a box-shaped partition wall 18 housing the spin chuck 8 and nozzles, an FFU (fan filter unit) 19 as a blower unit feeding clean air (air filtered by a filter) from an upper portion of the partition wall 18 into an interior of the partition wall 18, and an exhaust duct 20 exhausting gas inside the chamber 7 from a lower portion of the partition wall 18. The FFU 19 is disposed at an upper part of the partition wall 18 and is mounted to a ceiling of the partition wall 18. The FFU 19 feeds the clean air (that is, an atmosphere containing oxygen) downward into the chamber 7 from the ceiling of the partition wall 18. The exhaust duct 20 is connected to a bottom portion of the processing cup 17 and guides the gas inside the chamber 7 out toward an exhaust processing facility provided in a plant in which the substrate processing apparatus 1 is installed. A downflow (downward flow) that flows downward inside the chamber 7 is thus formed by the FFU 19 and the exhaust duct 20. The processing of the substrate W is performed in a state where the downflow is formed inside the chamber 7.

As shown in FIG. 2, in the present preferred embodiment, the spin chuck 8 is a vacuum suction type chuck. The spin chuck 8 suctions and supports a central portion of a lower surface of the substrate W. The spin chuck 8 includes a lower spin shaft 21 extending in a vertical direction, a spin base 22 mounted to an upper end of the lower spin shaft 21 and suctioning and holding the lower surface of the substrate W in the horizontal orientation, and a spin motor (substrate rotating unit) 23 having a rotating shaft coupled coaxially to the lower spin shaft 21. The spin base 22 includes a horizontal circular upper surface 22a having a smaller outer diameter than an outer diameter of the substrate W. In a state where the rear surface of the substrate W is suctioned and held by the spin base 22, an outer peripheral portion of the substrate W protrudes further outside than a peripheral end edge of the spin base 22. By the spin motor 23 being driven, the substrate W is rotated around a central axis of the lower spin shaft 21.

Also, the spin chuck 8 is not restricted to that of the vacuum suction type and, for example, a clamping type chuck that clamps the substrate W in a horizontal direction to hold the substrate W horizontally may be adopted instead.

The blocking member 9 includes a blocking plate 26 and an upper spin shaft 27 provided integrally rotatably on the blocking plate 26. The blocking plate 26 is of a disk shape that is larger than the diameter of the substrate W. The blocking plate 26 includes a disk portion 28 held in a horizontal orientation and a circular cylindrical portion 29 extending downward from an outer peripheral portion of the disk portion 28. The disk portion 28 is coaxial to the circular cylindrical portion 29. The disk portion 28 is disposed higher than a lower end of the circular cylindrical portion 29. A circular cylindrical penetrating hole penetrating vertically through the blocking plate 26 and the upper spin shaft 27 is formed in a central portion of the disk portion 28. An inner peripheral wall of the penetrating hole is demarcated by a circular cylindrical surface. The central nozzle 10 is inserted vertically through the penetrating hole.

The blocking plate 26 includes a cup-shaped inner surface that is recessed upward. The inner surface of the blocking plate 26 includes a substrate facing surface 26a facing an upper part of the upper surface of the substrate W and an inner peripheral surface 26b facing an outer peripheral end of the substrate W held by the spin chuck 8 in a state where the blocking member 9 is at a lower position. A lower surface of the disk portion 28 corresponds to the substrate facing surface 26a. The substrate facing surface 26a is a flat surface that is parallel to the upper surface of the substrate W held by the spin chuck 8.

An inner peripheral surface of the circular cylindrical portion 29 corresponds to the inner peripheral surface 26b. The inner peripheral surface 26b includes an annular inner inclined portion extending obliquely downward and outward from the substrate facing surface 26a. The inner inclined portion has an arcuate cross section with which an inclination angle with respect to the rotational axis A1 changes continuously. The cross section of the inner inclined portion is opened downward. An inner diameter of the inner peripheral surface 26b increases as a lower end of the inner peripheral surface 26b is approached. The lower end of the inner peripheral surface 26b has an inner diameter greater than the outer diameter of the substrate W held by the spin chuck 8.

The central nozzle 10 extends in an up/down direction along a vertical axis passing through centers of the blocking plate 26 and the substrate W, that is, along the rotational axis A1. The central nozzle 10 is disposed above the spin chuck 8 and is inserted through internal spaces of the blocking plate 26 and the upper spin shaft 27. The central nozzle 10 is elevated and lowered together with the blocking plate 26 and the upper spin shaft 27.

The upper spin shaft 27 is supported relatively rotatably by a supporting arm 31 extending horizontally above the blocking plate 26. A blocking plate rotating unit 32 of a configuration that includes an electric motor, etc., is coupled to the blocking plate 26 and the upper spin shaft 27. The blocking plate rotating unit 32 rotates the blocking plate 26 and the upper spin shaft 27 around the rotational axis A1 with respect to the supporting arm 31.

Also, a blocking member elevating/lowering unit 33 of a configuration that includes an electric motor, a ball screw, etc., is coupled to the supporting arm 31. The blocking member elevating/lowering unit 33 elevates and lowers the blocking member 9 (blocking plate 26 and upper spin shaft 27) and the central nozzle 10 together with the supporting arm 31 in the vertical direction.

The blocking member elevating/lowering unit 33 elevates and lowers the blocking plate 26 between a lower position (position indicated by broken lines in FIG. 2) such that the substrate facing surface 26a is proximal to the upper surface of the substrate W held by the spin chuck 8 and a height of the lower end of the circular cylindrical portion 29 is positioned lower than a substrate W height and an upper position (position indicated by solid lines in FIG. 2) retreated more largely upward than the lower position.

In the state where the blocking member 9 is positioned at the lower position, an internal space SP (hereinafter referred to as the "internal space SP"; see FIG. 8C, etc.) demarcated by the substrate facing surface 26a, the inner peripheral surface 26b, and the upper surface (pattern forming surface Wa) of the substrate W forms a blocked space. Although the blocked space is not necessarily isolated completely from a space peripheral thereto, there is hardly any flow of fluid between the internal space SP and an external space outside the internal space SP (a space at an inner side of the chamber 7 and outside the internal space SP). That is, in the state where the blocking member 9 is positioned at the lower position, an atmosphere of the internal space SP and an atmosphere of the space outside the internal space SP are substantially blocked from each other.

In a state where the blocking member 9 is positioned at the upper position, the lower end of the circular cylindrical portion 29 is positioned higher than an upper end 17a of the processing cup 17 that is in a first or second guard facing state (that is, an upper end of a second guard 84 at an upper position) as shown in FIG. 8I, etc. A height position of the upper end 17a of the processing cup 17 is set at a position enabling liquid splashing from the substrate W to be captured by the processing cup 17.

By setting the upper position of the blocking member 9 such that the lower end of the circular cylindrical portion 29 would be higher than the pattern forming surface Wa of the substrate W, liquid splashing from a peripheral edge portion of the substrate W can be suppressed or prevented from hitting (colliding against) the circular cylindrical portion 29 positioned at the upper position in the state where the blocking member 9 is positioned at the upper position. Additionally, by setting the upper position of the blocking member 9 such that the lower end of the circular cylindrical portion 29 would be higher than the upper end 17a of the processing cup 17, liquid splashing from the peripheral edge portion of the substrate W can be more reliably prevented from hitting (colliding against) the circular cylindrical portion 29 positioned at the upper position in the state where the blocking member 9 is positioned at the upper position.

The central nozzle 10 includes a circular columnar casing 40 extending vertically in an interior of the penetrating hole and a first nozzle piping 41, a second nozzle piping 46, a third nozzle piping 51, and a fourth nozzle piping 56 respectively inserted vertically through an interior of the casing 40. Each of the first nozzle piping 41, the second nozzle piping 46, the third nozzle piping 51, and the fourth nozzle piping 56 is an inner tube.

As shown in FIG. 3, a lower end of the first nozzle piping 41 opens to a substrate facing surface 40a of the casing 40 and forms a first discharge port (central portion discharge port) 41a. The chemical liquid from the chemical liquid supplying unit 11 is supplied to the first nozzle piping 41.

As shown in FIG. 2, the chemical liquid supplying unit 11 includes a chemical liquid piping 42 connected to an upstream end side of the first nozzle piping 41, a chemical liquid valve 43 interposed in an intermediate portion of the chemical liquid piping 42, and a first flow control valve 44 adjusting an opening degree of the chemical liquid piping 42. A chemical liquid (of low dissolved oxygen concentration) that has been reduced in dissolved oxygen amount is supplied to the chemical liquid piping 42 from a chemical liquid supplying portion (dissolved oxygen reducing unit) 150. The first flow control valve 44 may be of a configuration that includes a valve body provided with a valve seat in an interior, a valve element opening and closing the valve seat, and an actuator that moves the valve element between an open position and a closed position. Other flow control valves are also of equivalent configurations.

When the chemical liquid valve 43 is opened, a liquid solvent is discharged downward from the first discharge port 41a. When the chemical liquid valve 43 is closed, discharge of the chemical liquid from the first discharge port 41a is stopped. A discharge flow rate of the chemical liquid from the first discharge port 41a is adjusted by the first flow control valve 44. As examples of the chemical liquid, hydrofluoric acid (dilute hydrofluoric acid), buffered hydrofluoric acid (buffered HF: liquid mixture of hydrofluoric acid and ammonium fluoride), FOM (hydrofluoric acid/ozone mixture), FPM (hydrofluoric acid/hydrogen peroxide mixture), SC1 (ammonia/hydrogen peroxide mixture), SC2 (hydrochloric acid/hydrogen peroxide mixture), SPM (sulfuric acid/hydrogen peroxide mixture), polymer removing liquid, etc., can be cited. A chemical liquid that contains hydrofluoric acid (hydrofluoric acid, buffered hydrofluoric acid, FOM, FPM, etc.) is suitable as an etching liquid for removing an oxide film (silicon oxide film).

Hydrofluoric acid supplied to the chemical liquid piping 42 is that which is sufficiently reduced in dissolved oxygen amount in order to prevent oxidation of the pattern forming surface Wa by oxygen in the hydrofluoric acid. A chemical liquid after being reduced in dissolved oxygen amount by degassing by the chemical liquid supplying portion 150 is supplied to the chemical liquid piping 42.

As shown in FIG. 3, a lower end of the second nozzle piping 46 opens to the substrate facing surface 40a of the casing 40 and forms a second discharge port (central portion discharge port) 46a. The rinse liquid from the rinse liquid supplying unit 12 is supplied to the second nozzle piping 46.

As shown in FIG. 2, the rinse liquid supplying unit 12 includes a rinse liquid piping 47 connected to an upstream end side of the second nozzle piping 46, a rinse liquid valve 48 interposed in an intermediate portion of the rinse liquid piping 47, and a second flow control valve 49 adjusting an opening degree of the rinse liquid piping 47. When the rinse liquid valve 48 is opened, the rinse liquid is discharged downward from the second discharge port 46a. When the rinse liquid valve 48 is closed, discharge of the rinse liquid from the second discharge port 46a is stopped. A discharge flow rate of the rinse liquid from the second discharge port 46a is adjusted by the second flow control valve 49.

The rinse liquid is water. The water is, for example, deionized water (DIW) but is not restricted to DIW and may be any of carbonated water, electrolyzed ion water, hydrogen water, ozone water, ammonia water, and aqueous hydrochloric acid solution of dilute concentration (of, for example, approximately 10 ppm to 100 ppm).

As shown in FIG. 3, a lower end of the third nozzle piping 51 opens to the substrate facing surface 40a of the casing 40 and forms a third discharge port (central portion discharge port) 51a. The solvent from the solvent supplying unit 15 is supplied to the third nozzle piping 51.

As shown in FIG. 2, the solvent supplying unit 15 includes a solvent piping 52 connected to an upstream end side of the third nozzle piping 51, a solvent valve 53 interposed in an intermediate portion of the solvent piping 52, and a third flow control valve 54 adjusting an opening degree of the solvent piping 52. When the solvent valve 53 is opened, the solvent is discharged downward from the third discharge port 51a. When the solvent valve 53 is closed, discharge of the solvent from the third discharge port 51a is stopped. A discharge flow rate of the solvent from the third discharge port 51a is adjusted by the third flow control valve 54. The solvent supplied to the solvent piping 52 has solubility (miscibility) with respect to the filler supplied by the filler supplying unit 16. That is, the solvent has solubility (miscibility) with respect to the filler. The solvent is used as an intermediate processing liquid supplied to the pattern forming surface Wa prior to supplying of the filler to the pattern forming surface Wa.

In a substrate processing example to be described below, the solvent is supplied to the pattern forming surface Wa after supplying of the rinse liquid (water) to the pattern forming surface Wa and prior to the supplying of the filler to the pattern forming surface Wa. Therefore, it is desirable for the solvent to further have solubility (miscibility) with respect to the rinse liquid as well.

A specific example of the solvent supplied to the solvent piping 52 is an organic solvent as represented, for example, by IPA (isopropyl alcohol). As such an organic solvent, besides IPA, for example, methanol, ethanol, acetone, EG (ethylene glycol), HFE (hydrofluoroether), n-butanol, t-butanol, isobutyl alcohol, and 2-butanol can be cited as examples. Also, in regard to an organic solvent, not just a case where it is constituted of just a singular component but a liquid mixed with another component is also allowable. Also, a solvent other than an organic solvent can be used.

As shown in FIG. 3, a lower end of the fourth nozzle piping 56 opens to the substrate facing surface 40a of the casing 40 and forms a fourth discharge port (inert gas discharge port) 56a. The inert gas from the inert gas supplying unit 14 is supplied to the fourth nozzle piping 56.

As shown in FIG. 2, the inert gas supplying unit 14 includes an inert gas piping 57 connected to an upstream end side of the fourth nozzle piping 56, an inert gas valve 58 interposed in an intermediate portion of the inert gas piping 57, and a fourth flow control valve 59 adjusting an opening degree of the inert gas piping 57. When the inert gas valve 58 is opened, the inert gas is discharged (blown out) downward from the fourth discharge port 56a. When the inert gas valve 58 is closed, discharge of the inert gas from the fourth discharge port 56a is stopped. A discharge flow rate of the inert gas from the fourth discharge port 56a is adjusted by the fourth flow control valve 59. The inert gas includes, for example, nitrogen gas and argon gas.

As shown in FIG. 2, the solvent supplying unit 15 includes a solvent nozzle 61, a nozzle arm 62 with the solvent nozzle 61 mounted to a tip portion, and a nozzle moving unit 63 that moves the nozzle arm 62 to move the solvent nozzle 61. The nozzle moving unit 63 moves the nozzle arm 62 horizontally around a swinging axis extending along the vertical direction to move the solvent nozzle 61 horizontally. The nozzle moving unit 63 is of a configuration that includes a motor, etc. The nozzle moving unit 63 moves the solvent nozzle 61 horizontally between a processing position at which the solvent discharged from the solvent nozzle 61 lands on the pattern forming surface Wa and a retreat position set outside the substrate W in plan view. In other words, the processing position is a position at which the solvent discharged from the solvent nozzle 61 is supplied to the pattern forming surface Wa.

The solvent supplying unit 15 includes a solvent piping 64 guiding the solvent to the solvent nozzle 61 and a solvent valve 65 opening and closing the solvent piping 64. When the solvent valve 65 is opened, the solvent from a solvent supply source is supplied from the solvent piping 64 to the solvent nozzle 61. The solvent is thereby discharged from the solvent nozzle 61. The solvent supplied to the solvent piping 64 is of the same type as the solvent supplied to the solvent piping 52.

As shown in FIG. 2, the filler supplying unit 16 includes a filler nozzle 66 having a discharge port 66a, a nozzle arm 67 with the filler nozzle 66 mounted to a tip portion in a state where the discharge port 66a is faced downward, and a nozzle moving unit 68 that moves the nozzle arm 67 to move the filler nozzle 66. The nozzle moving unit 68 moves the nozzle arm 67 horizontally around a swinging axis extending along the vertical direction to move the filler nozzle 66 horizontally. That is, it is possible to move the filler nozzle 66 along the pattern forming surface Wa of the substrate W held by the spin chuck 8. The nozzle moving unit 68 is of an arrangement that includes a motor, etc. The nozzle moving unit 68 moves the filler nozzle 66 horizontally between a processing position (the central portion in the substrate processing example described below) at which the filler discharged from the filler nozzle 66 lands on the pattern forming surface Wa and a retreat position set outside the substrate W in plan view.

The filler supplying unit 16 includes a filler piping (filler supplying unit) 69 guiding the filler to the filler nozzle 66 and a filler valve (filler supplying unit) 70 opening and closing the filler piping 69. When the filler valve 70 is opened, the filler from a filler supply source is supplied from the filler piping 69 to the filler nozzle 66. The filler is thereby discharged downward from the discharge port 66a of the filler nozzle 66. The filler supplied to the filler piping 69, for example, contains a polymer such as an acrylic resin, etc. The filler supplied to the filler piping 69 is a solution in which the polymer is dissolved as a solute in a solvent, for example, water or an organic solvent, etc.

As shown in FIG. 2, the processing cup 17 is disposed further outward (in a direction away from the rotational axis A1) than the substrate W held by the spin chuck 8.

The configuration of the processing cup 17 shall mainly be described below. The processing cup 17 shall be described with reference to FIG. 2 and additionally to FIG. 8A as appropriate.

The processing cup 17 includes a circular cylindrical member 80, a plurality of cups (first cup 81 and second cup 82) surrounding the spin chuck 8 at an inner side of the circular cylindrical member 80, a plurality of guards (first guard 83 and second guard 84) receiving processing liquids (chemical liquid, rinse liquid, solvent, filler, etc.) that splashed to surroundings of the substrate W, and a guard elevating/lowering unit 85 that elevates and lowers the plurality of guards (first guard 83 and second guard 84) individually. The processing cup 17 is disposed further outside (in the direction away from the rotational axis A1) than an outer periphery of the substrate W held by the spin chuck 8.

Each of the cups (first cup 81 and second cup 82) is of circular cylindrical shape (circular annular shape) and surrounds the spin chuck 8. The second cup 82 at an outer side is disposed further outside than the first cup 81 at an inner side. Each of the cups (first cup 81 and second cup 82) forms an annular groove that is opened upward.

A drain piping 86 is connected to the groove of the first cup 81. The processing liquid (chemical liquid or rinse liquid) guided to the groove of the first cup 81 is fed through the drain piping 86 to a drain processing facility outside the apparatus and subject to drain processing in the drain processing facility.

A piping 87 is connected to the groove of the second cup 82. A solvent recovery piping 88 configured to recover the solvent, a solvent drain piping 89 configured to drain the solvent, and a filler drain piping 90 configured to drain the filler are connected to the piping 87. A solvent recovery valve 91 that opens and closes the solvent recovery piping 88 is interposed in the solvent recovery piping 88. A solvent drain valve 92 that opens and closes the solvent drain piping 89 is interposed in the solvent drain piping 89. A filler drain valve 93 that opens and closes the filler drain piping 90 is interposed in the filler drain piping 90. By opening the solvent recovery valve 91 in a state where the solvent drain valve 92 and the filler drain valve 93 are closed, a liquid flowing through the piping 87 is guided to the solvent recovery piping 88. By opening the solvent drain valve 92 in a state where the solvent recovery valve 91 and the filler drain valve 93 are closed, the liquid flowing through the piping 87 is guided to the solvent drain piping 89. By opening the filler drain valve 93 in a state where the solvent recovery valve 91 and the solvent drain valve 92 are closed, the liquid flowing through the piping 87 is guided to the filler drain piping 90.

The first guard 83 at the inner side surrounds the spin chuck 8 and has a shape that is substantially rotationally symmetrical with respect to the axis A1 of rotation of the substrate W by the spin chuck 8. The first guard 83 includes a lower end portion 94 of circular cylindrical shape that surrounds the spin chuck 8, a cylindrical portion 95 extending outward (in the direction away from the rotational axis A1 of the substrate W) from an upper end of the lower end portion 94, an intermediate portion 96 of circular cylindrical shape that extends vertically upward from an upper surface outer peripheral portion of the cylindrical portion 95, and an inclined portion 97 of circular annular shape that extends obliquely upward toward an inner side (in a direction of approaching the rotational axis A1 of the substrate W) from an upper end of the intermediate portion 96. The lower end portion 94 is positioned on the groove of the first cup 81 and is housed in an interior of the groove of the first cup 81 in a state where the first guard 83 and the first cup 81 are most proximate to each other. An inner peripheral end 83a (tip of the inclined portion 97) of the first guard 83 forms a circular shape of larger diameter than the substrate W held by the spin chuck 8 in plan view. Also, as show in FIG. 2, etc., a cross-sectional shape of the inclined portion 97 is a rectilinear shape.

The second guard 84 at the outer side surrounds of the spin chuck 8 at an outer side of the first guard 83 and has a shape that is substantially rotationally symmetrical with respect to the axis A1 of rotation of the substrate W by the spin chuck 8. The second guard 84 has a circular cylindrical portion 98 that is coaxial to the first guard 83 and an inclined portion 99 that extends obliquely upward toward a center side (in the direction of approaching the rotational axis A1 of the substrate W) from an upper end of the circular cylindrical portion 98. An inner peripheral end 84a (tip of the inclined portion 99) of the second guard 84 forms a circular shape of larger diameter than the substrate W held by the spin chuck 8 in plan view. A cross-sectional shape of the inclined portion 99 is a rectilinear shape.

The circular cylindrical portion 98 is positioned on the groove of the second cup 82. Also, the inclined portion 99 is provided such as to overlap above the inclined portion 97 of the first guard 83. A minute gap is maintained between the inclined portion 99 and the inclined portion 97 in a state where the first guard 83 and the second guard 84 are most proximate to each other.

Folded-back portions 97a and 99a that are bent downward are formed at inner peripheral ends of tips of the respective inclined portions 97 and 99 (of the respective guards (first guard 83 and second guard 84)).

The respective guards (first guard 83 and second guard 84) are elevated and lowered between upper positions and lower positions by driving of the guard elevating/lowering unit 85.

When the first guard 83 is positioned at the upper position, the tip of the inclined portion 97 is positioned higher than the upper surface of the substrate W. When the first guard 83 is positioned at the lower position, the tip of the inclined portion 97 is positioned lower than the upper surface of the substrate W. When the second guard 84 is positioned at the upper position, the tip of the inclined portion 99 is positioned higher than the upper surface of the substrate W. When the second guard 84 is positioned at the lower position, the tip of the inclined portion 99 is positioned lower than the upper surface of the substrate W.

Supplying of the processing liquids (chemical liquid, rinse liquid, solvent, filler, etc.) to the substrate Wand drying of the substrate Ware performed in a state where either of the guards (first guard 83 and second guard 84) face lateral sides of the substrate W.

To realize a state where the first guard 83 faces the lateral sides of the substrate W, both of the two guards (first guard 83 and second guard 84) are disposed at the upper positions. In the first guard facing state, all of the processing liquid expelled from the peripheral edge portion of the substrate W in a rotating state is received by the first guard 83.

Also, to realize a state where the second guard 84 faces the lateral sides of the substrate W (may hereinafter be referred to as the "second guard facing state"), the first guard 83 is disposed at the lower position and the second guard 84 is disposed at the upper position. In the second guard facing state, all of the processing liquid expelled from the peripheral edge portion of the substrate W in the rotating state is received by the second guard 84.

Figure 4:
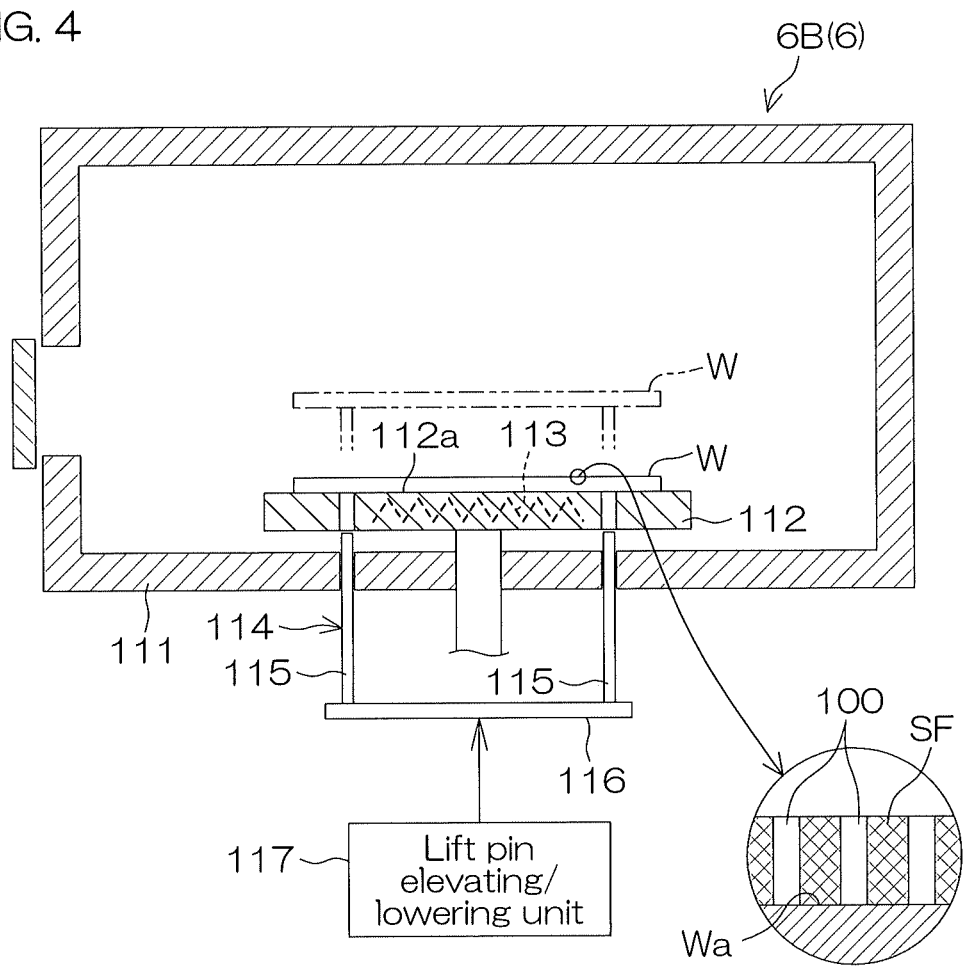
FIG. 4 is an illustrative view for describing a configuration example of a baking unit included in the substrate processing apparatus.

FIG. 4 is an illustrative view for describing an configuration example of a baking unit 6B included in the substrate processing apparatus.

The baking unit 6B includes a chamber 111 and a hot plate 112. The hot plate 112 has an upper surface 112a. The hot plate 112 contactingly supports the lower substrate W from below and heats the substrate W from below by the upper surface 112a. A built-in heater 113 is incorporated in the hot plate 112. The built-in heater 113 is a heater that generates Joule heat and, for example, is a heating wire that generates heat upon being supplied with current. A temperature of the upper surface 112a of the hotplate 112 is uniform within the surface. The lower surface of the substrate W is heated uniformly by radiant heat from the hot plate 112. By heating the substrate W by the hot plate 112, the filler supplied to the pattern forming surface Wa can be solidified to form a solidified film SF of the filler (solidified film forming step).

The baking unit 6B further includes an elevating/lowering unit 114 configured to elevate and lower the substrate W. The elevating/lowering unit 114 further includes a plurality (for example, three) of lift pins 115 that elevate and lower the substrate W with respect to the hotplate 112, a supporting member 116 in common that supports the plurality of lift pins 115, and a lift pin elevating/lowering unit 117 coupled to the lift pins 115. The lift pin elevating/lowering unit 117 is configured from a cylinder, etc.

Figure 5:
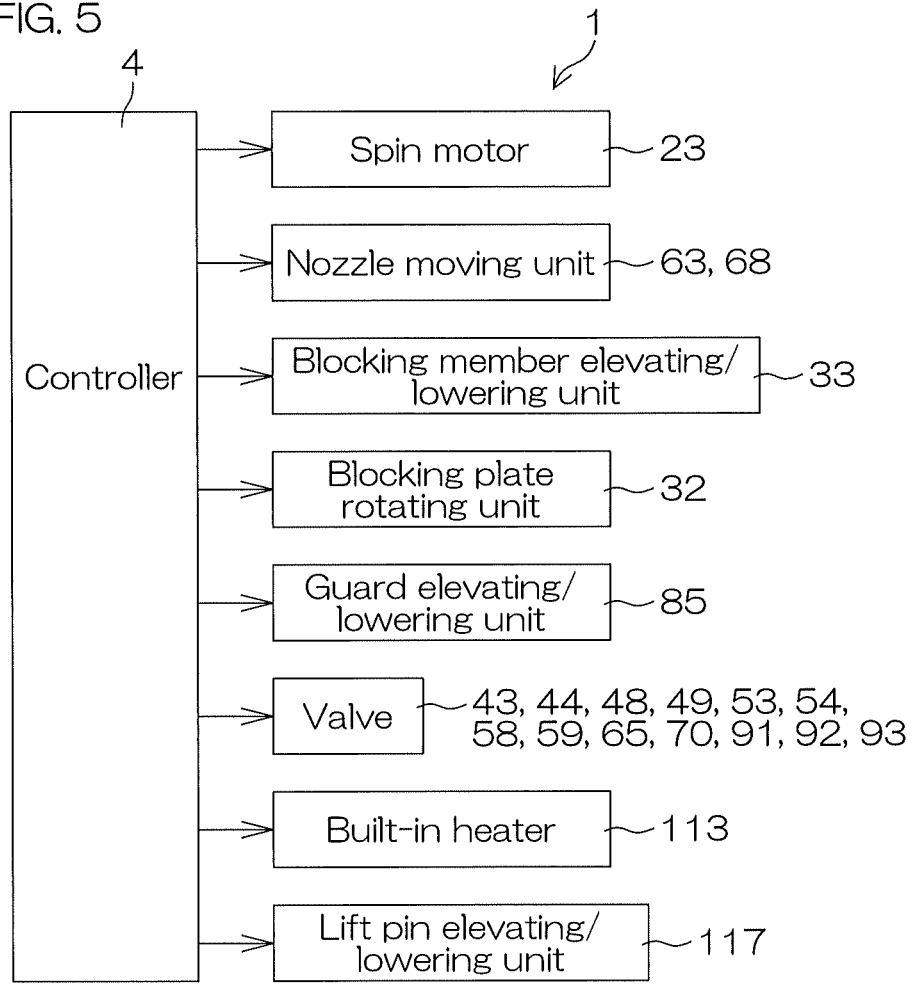
FIG. 5 is a block diagram for describing the electrical configuration of a main portion of the substrate processing apparatus.

FIG. 5 is a block diagram for describing the electrical configuration of a main portion of the substrate processing apparatus 1.

The controller 4 is configured using, for example, a microcomputer. The controller 4 has a computing unit, such as a CPU, etc., a fixed memory device, a storage unit, such as a hard disk drive, etc., and an input/output unit. A program executed by the computing unit is stored in the storage unit.

Also, the spin motor 23, the nozzle moving units 63 and 68, the blocking member elevating/lowering unit 33, the blocking plate rotating unit 32, the guard elevating/lowering unit 85, etc., are connected as control objects to the controller 4. The controller 4 controls operations of the spin motor 23, the nozzle moving units 63 and 68, the blocking member elevating/lowering unit 33, the blocking plate rotating unit 32, the guard elevating/lowering unit 85, etc., in accordance with the predetermined program.

Also, the controller 4 opens and closes the chemical liquid valve 43, the rinse liquid valve 48, the solvent valve 53, the inert gas valve 58, the solvent valve 65, the filler valve 70, the solvent recovery valve 91, the solvent drain valve 92, the filler drain valve 93, etc., in accordance with the predetermined program.

Also, the controller 4 adjusts the opening degrees of the first flow control valve 44, the second flow control valve 49, the third flow control valve 54, the fourth flow control valve 59, etc., in accordance with the predetermined program.

A case of processing a substrate W with patterns formed on the pattern forming surface Wa shall be described below.

Figure 6:
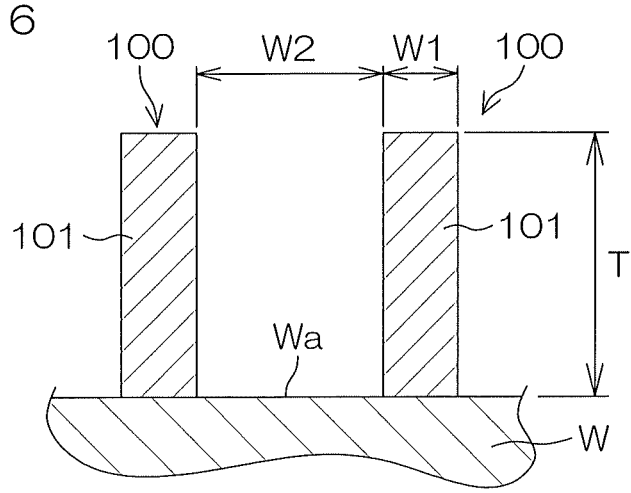
FIG. 6 is an enlarged sectional view of a pattern forming surface of a substrate that is an object of processing by the substrate processing apparatus.

FIG. 6 is an enlarged sectional view of the pattern forming surface Wa of the substrate W that is an object of processing by the substrate processing apparatus 1. The substrate W that is the object of processing is, for example, a silicon wafer and patterns 100 are formed on the pattern forming surface Wa. The patterns 100 are, for example, fine patterns. The patterns 100 may be those with which structural bodies 101 having projecting shapes (columnar shapes) are disposed in a matrix as shown in FIG. 6. In this case, line widths W1 of the structural bodies 101 are set, for example, to approximately 10 nm to 45 nm and gaps W2 of the patterns 100 are set, for example, to approximately 10 nm to several μm, respectively. A film thickness T of the patterns 100 is, for example, approximately 1 μm. Also, with the patterns 100, for example, an aspect ratio (ratio of the film thickness T with respect to the line width W1) may, for example, be approximately 5 to 500 (is typically approximately 5 to 50).

Also, the patterns 100 may be those with which line shaped patterns formed by fine trenches are aligned repeatedly. Also, the patterns 100 may be formed by providing a plurality of fine holes (voids or pores) in a thin film.

The patterns 100 include, for example, an insulating film. Also, the patterns 100 may include a conductor film. More specifically, the patterns 100 are formed of a laminated film with which a plurality of films are laminated and may further include an insulated film and a conductor film. The patterns 100 may be patterns constituted of a single layer film. The insulating film may be a silicon oxide film ($SiO_2$ film) or a silicon nitride film (SiN film). Also, the conductor film may be an amorphous silicon film introduced with an impurity for achieving low resistance or may be a metal film (for example, a metal wiring film).

Also, the patterns 100 may be hydrophilic films. A TEOS film (a type of silicon oxide film) can be cited as an example of a hydrophilic film.

Figure 7:
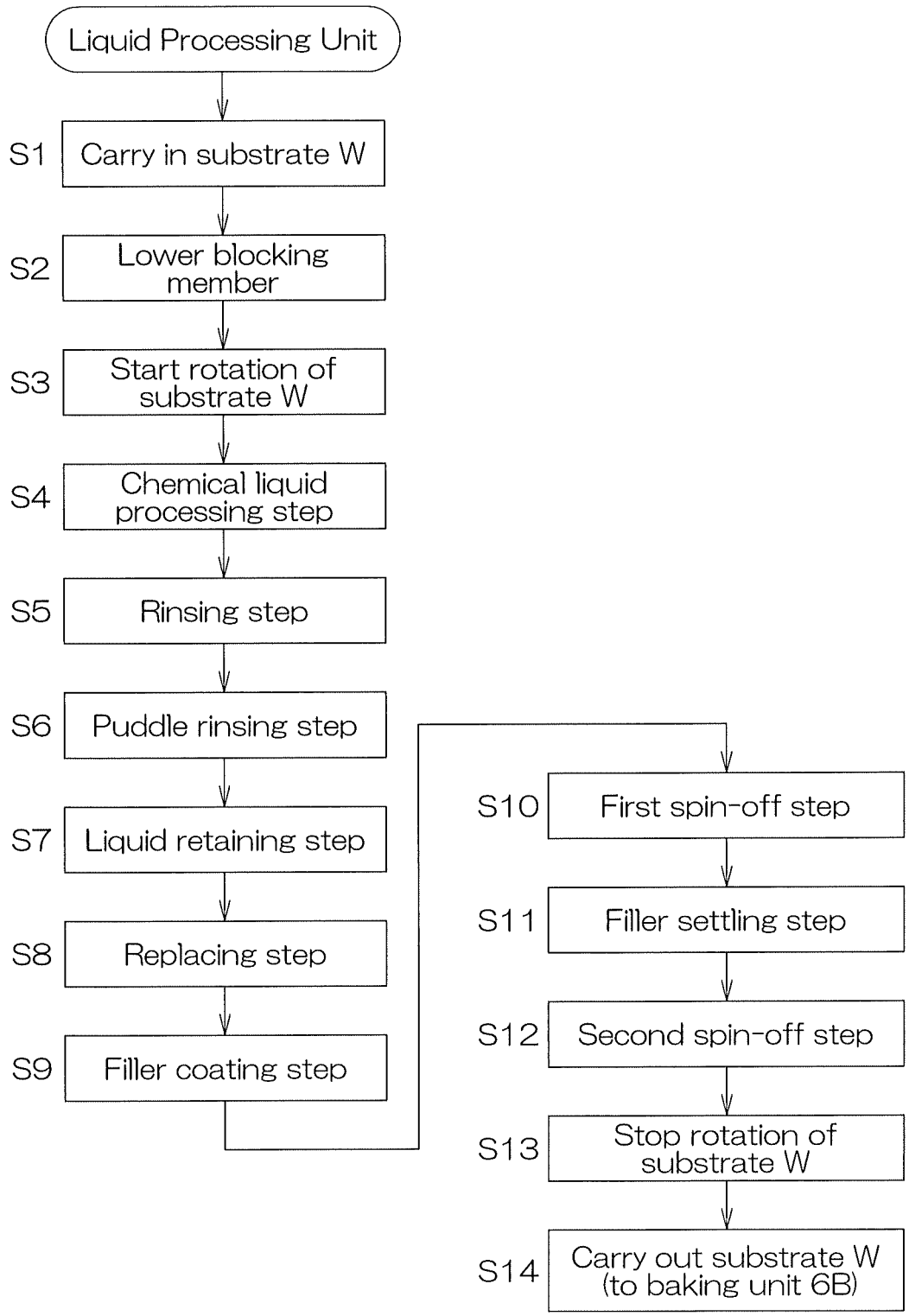
FIG. 7 is a flowchart for describing contents of a substrate processing example executed in the liquid processing unit.

FIG. 7 is a flowchart for describing contents of a substrate processing example executed in the liquid processing unit 6A. FIG. 8A to FIG. 8O are schematic views for describing the substrate processing example.

The substrate processing example shall be described with reference to FIG. 1 to FIG. 7. FIG. 8A to FIG. 8O shall be referenced as appropriate.

First, an unprocessed substrate W (for example, a circular substrate of 300 mm diameter) is carried into an interior of the chamber 7 (step S1 of FIG. 7). The unprocessed substrate W is transferred from a substrate container C to the second transfer robot CR2 via the indexer robot IR and the first transfer robot CR1. The substrate W is then carried into the interior of the chamber 7 by the second transfer robot CR2 and the substrate W is transferred onto the spin chuck 8 in a state where its pattern forming surface Wa is faced upward. Thereafter, the substrate W is held by the spin chuck 8 as shown in FIG. 8A by the central portion of the lower surface (the rear surface at an opposite side to the pattern forming surface) of the substrate W being suctioned and supported (substrate holding step).

Carrying-in of the substrate W into the chamber 7 is performed in a state where the guards (first guard 83 and second guard 84) are disposed at the lower positions, a state where the solvent nozzle 61 and the filler nozzle 66 are retreated at the retreat positions, and the blocking member 9 is retreated at the upper position.

After the second transfer robot CR2 retreats out of the liquid processing unit 6A, the controller 4 controls the blocking member elevating/lowering unit 33 to lower the blocking member 9 and position it at the lower position as shown in FIG. 8B. The internal space SP between the substrate facing surface 26a and the upper surface of the substrate W is thereby made a blocked space (step S2 of FIG. 7: lower blocking member, lower position disposing step).

Also, the controller 4 controls the guard elevating/lowering unit 85 to elevate the first guard 83 and the second guard 84 to make the first guard 83 face the lateral sides of the substrate W. The first guard facing state is thereby realized.

Next, the controller 4 controls the spin motor 23 to raise a rotational speed of the spin base 22 to a predetermined liquid processing speed (within a range of 10 to 1200 rpm; for example, 1000 rpm) and keep it at the liquid processing speed (step S3 of FIG. 7: start rotation of substrate W). In accompaniment with rotation of the spin base 22, the substrate W is rotated around the rotational axis A1.

Also, the controller 4 controls the blocking plate rotating unit 32 to rotate the blocking plate 26 around the rotational axis A1. The blocking plate 26 may be put in synchronous rotation with the substrate W. Synchronous rotation refers to rotation at the same rotational speed in the same rotation direction.

Also, the controller 4 opens the inert gas valve 58. The inert gas is thereby discharged downward (that is, toward the central portion of the pattern forming surface Wa) from the fourth discharge port 56a of the central nozzle 10 (fourth nozzle piping 56) as shown in FIG. 8B (inert gas supplying step). The discharge flow rate of the inert gas at this point is, for example, 20 to 100 (liters/minute) and is preferably 55 (liters/minute). Due to the inert gas of such large flow rate being supplied to the internal space SP, the atmosphere inside the internal space SP is put in a low oxygen concentration state. The inert gas discharged from the fourth discharge port 56a spreads along the pattern forming surface Wa in the internal space SP between the pattern forming surface Wa and the substrate facing surface 26a of the blocking member 9. By the internal space SP thereby being filled with the inert gas, reduction of oxygen concentration in the atmosphere of the internal space SP is achieved.

When a time sufficient for the internal space SP to be replaced with the internal gas elapses and the rotation of the substrate W reaches the liquid processing speed, the controller 4 starts execution of a chemical liquid processing step (step S4 of FIG. 7) of using hydrofluoric acid as an example of the chemical liquid to process the pattern forming surface Wa as shown in FIG. 8C.

In the chemical liquid processing step (step S4 of FIG. 7), the controller 4 opens the chemical liquid valve 43. Thereby, hydrofluoric acid is discharged from the first discharge port 41a of the central nozzle 10 (first nozzle piping 41) toward the central portion of the pattern forming surface Wa of the substrate W in the rotating state (chemical liquid supplying step). The discharge flow rate of the hydrofluoric acid at this point is, for example, 2 (liters/minute). As the hydrofluoric acid supplied to the pattern forming surface Wa, that which is sufficiently reduced in dissolved oxygen amount is used. The pattern forming surface Wa is thereby suppressed or prevented from being oxidized by the dissolved oxygen in the hydrofluoric acid in the chemical liquid processing step (S4 of FIG. 7).

The hydrofluoric acid supplied to the pattern forming surface Wa moves to the peripheral edge portion of the substrate W upon receiving a centrifugal force due to the rotation of the substrate W. A liquid film LF1 of the hydrofluoric acid that covers an entirety of the pattern forming surface Wa is thereby formed on the pattern forming surface Wa. The pattern forming surface Wa is covered with the hydrofluoric acid. By the hydrofluoric acid contained in the liquid film LF1 of the hydrofluoric acid contacting the pattern forming surface Wa, the pattern forming surface Wa is processed using the hydrofluoric acid. Specifically, a natural oxide film (silicon oxide film) formed on the pattern forming surface Wa is removed by the hydrofluoric acid.

The hydrofluoric acid that moved to the peripheral edge portion of the substrate W splashes toward the lateral sides of the substrate W from the peripheral edge portion of the substrate W. The hydrofluoric acid expelled from the peripheral edge portion of the substrate W is received by the inner peripheral surface 26b of the blocking member 9 and thereafter splashes laterally from a lower end portion of the circular cylindrical portion 29 of the blocking plate 26. The hydrofluoric acid splashing from the circular cylindrical portion 29 is received by an inner wall of the first guard 83, flows down along the inner wall of the first guard 83, and is fed to the drain processing facility outside the apparatus via the first cup 81 and the drain piping 86.

In the chemical liquid processing step (step S4 of FIG. 7), supplying of the inert gas is performed continuously. Also, the atmosphere that contains oxygen is present in the space outside the internal space SP. However, the blocking member 9 is disposed at the lower position and therefore there is hardly any flow of fluid between the internal space SP and the space outside the internal space SP. That is, in the state where the blocking member 9 is positioned at the lower position, the atmosphere of the internal space SP and the atmosphere of the space outside (that contains oxygen) are substantially blocked from each other.

By the above, entry of the atmosphere of the space outside (atmosphere that contains oxygen) into the internal space SP can be suppressed or prevented and therefore, the atmosphere inside the internal space SP can be maintained at a low oxygen concentration in the chemical liquid processing step (step S4 of FIG. 7).

When a predetermined period elapses from start of discharge of the hydrofluoric acid, the controller 4 closes the chemical liquid valve 43 and stops the discharge of the hydrofluoric acid from the central nozzle 10 (first nozzle piping 41). The chemical liquid processing step (step S4 of FIG. 7) thereby ends.

Next, the controller 4 executes a rinsing step (step S5 of FIG. 7) for replacing the hydrofluoric acid on the substrate W with the rinse liquid to eliminate the hydrofluoric acid from the substrate W as shown in FIG. 8D. Specifically, while keeping the rotations of the substrate W and the blocking plate 26 at the liquid processing speed, the controller 4 opens the rinse liquid valve 48. The rinse liquid is thereby discharged toward the central portion of the pattern forming surface Wa of the substrate W in the rotating state from the second discharge port 46a of the central nozzle 10 (second nozzle piping 46). The rinse liquid supplied to the upper surface central portion of the substrate W moves to the peripheral edge portion of the substrate W upon receiving the centrifugal force due to the rotation of the substrate W. A liquid film LF2 of the rinse liquid that covers the entirety of the pattern forming surface Wa is thereby formed on the pattern forming surface Wa. By the pattern forming surface Wa being covered with the rinse liquid, the hydrofluoric acid attached to the pattern forming surface Wa is rinsed off by the rinse liquid.

The rinse liquid that moved to the peripheral edge portion of the substrate W splashes toward the lateral sides of the substrate W from the peripheral edge portion of the substrate W. The rinse liquid expelled from the peripheral edge portion of the substrate W is received by the inner peripheral surface 26b of the blocking member 9 and thereafter splashes laterally from the lower end portion of the circular cylindrical portion 29 of the blocking plate 26. The rinse liquid splashing from the circular cylindrical portion 29 is received by the inner wall of the first guard 83, flows down along the inner wall of the first guard 83, and is fed to the drain processing facility outside the apparatus via the first cup 81 and the drain piping 86.

When a predetermined period elapses from start of discharge of the rinse liquid, the controller 4, while continuing the discharge of the rinse liquid, controls the spin motor 23 and the blocking plate rotating unit 32 to decelerate the rotational speeds of the substrate W and the blocking plate 26 stepwise from the liquid processing speed to a puddle speed (a low rotational speed of zero or not more than 40 rpm; for example, 10 rpm in the present substrate processing example) in a state where the entirety of the pattern forming surface Wa is covered with the rinse liquid. Thereafter, the rotational speed of the substrate W is kept at the puddle speed (puddle rinsing step (step S6 of FIG. 7)). The liquid film LF2 of the rinse liquid covering the entirety of the pattern forming surface Wa is thereby supported thereon as a puddle as shown in FIG. 8E. In this state, the centrifugal force acting on the liquid film LF2 of the rinse liquid is smaller than a surface tension acting between the rinse liquid and the upper surface of the substrate W or the centrifugal force and the surface tension are substantially countervailed. By deceleration of the substrate W, the centrifugal force acting on the rinse liquid on the substrate W weakens and an amount of the rinse liquid expelled from the substrate W decreases. A thickness of the liquid film LF2 of the rinse liquid maintained on the pattern forming surface Wa thereby increases.

When a predetermined period elapses from when the substrate W is decelerated to the puddle speed, the controller 4 closes the rinse liquid valve 48 while keeping the rotation of the substrate W at the puddle speed. The discharge of the rinse liquid from the central nozzle 10 (second nozzle piping 46) is thereby stopped as shown in FIG. 8F. Thereby, the liquid film LF2 of the rinse liquid maintained on the pattern forming surface Wa gathers overall to the central portion and the film thickness of the liquid film LF2 of the rinse liquid can be made sufficiently thick (liquid retaining step (step S7 of FIG. 7)). The oxidation of the pattern forming surface Wa can thereby be suppressed or prevented reliably. The above is performed under the low oxygen atmosphere and therefore the oxidation of the pattern forming surface Wa can be suppressed or prevented more reliably.

Figure 8G:
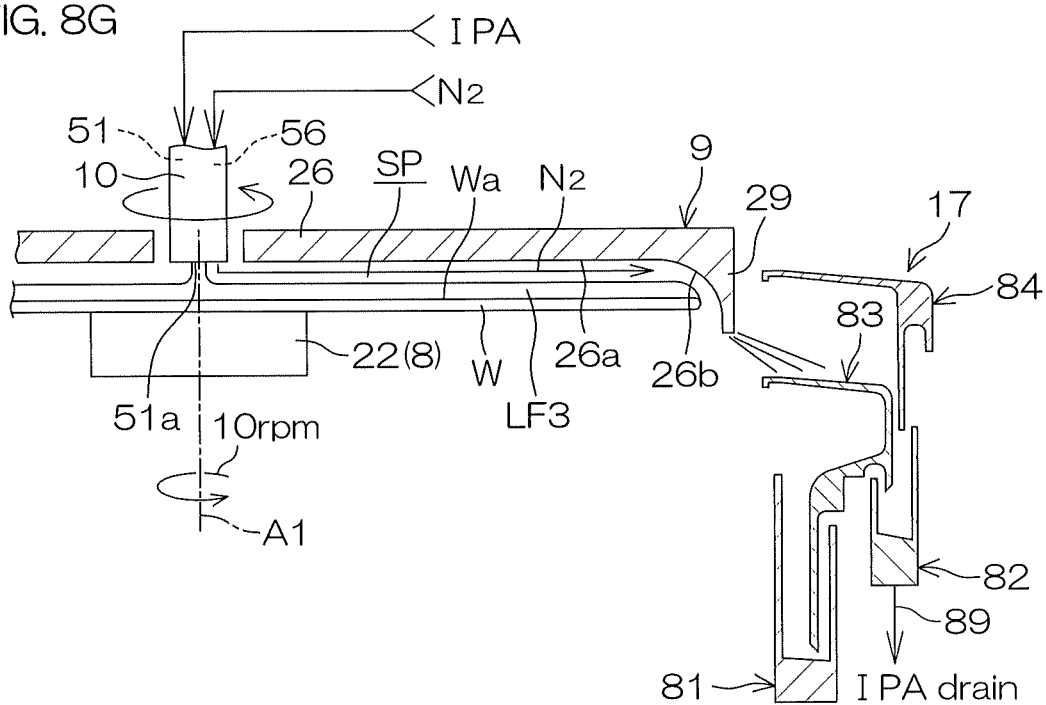
FIG. 8G is an illustrative view for describing a step subsequent to that of FIG. 8F.

When a predetermined period elapses from stoppage of discharge of the rinse liquid, the controller 4 starts execution of a replacing step (step S8 of FIG. 7; solvent processing step, intermediate processing step) next as shown in FIG. 8G. The replacing step (step S8 of FIG. 7) is a step of replacing the rinse liquid on the substrate W with a solvent (IPA in the present example) of high solubility (miscibility) with respect to the filler. Depending on its type, the filler may not have solubility (miscibility) with respect to the rinse liquid. By replacing the liquid film LF2 of the rinse liquid covering the pattern forming surface Wa with a solvent such that has solubility (miscibility) with respect to the filler, steps from a filler coating step (step S9 of FIG. 7) onward can be executed smoothly.

Specifically, the controller 4 controls the guard elevating/lowering unit 85 to lower the first guard 83 of the processing cup 17 in the first guard facing state to the lower position to make the second guard 84 face the lateral sides of the substrate W. The second guard facing state is thereby realized. That is, the replacing step (step S8 of FIG. 7) is executed in a state where the blocking member 9 is positioned at the lower position and the second guard facing state is realized.

Specifically, the controller 4 opens the solvent valve 53 while keeping the rotational speed of the substrate W at the puddle speed. IPA as an example of the solvent is thereby discharged toward the central portion of the pattern forming surface Wa of the substrate W in the rotating state from the third discharge port 51a of the central nozzle 10 (third nozzle piping 51) (intermediate processing liquid supplying step). At this point, the discharge flow rate of the IPA from the third discharge port 51a is set, for example, to 300 (milliliters/minute). The rinse liquid contained in the liquid film LF2 of the rinse liquid is thereby replaced successively by the IPA. A liquid film LF3 of the IPA (liquid film of the intermediate processing liquid) that covers the entirety of the upper surface of the substrate W is thereby maintained as a puddle on the pattern forming surface Wa. The rinse liquid of the liquid film LF2 of the rinse liquid that is sufficiently thick in film thickness is replaced with the IPA to form the liquid film LF3 of the IPA and therefore, a film thickness of the liquid film LF3 of the IPA can also be made sufficiently thick. The oxidation of the pattern forming surface Wa can thereby be suppressed or prevented reliably. The above is performed under the low oxygen atmosphere and therefore the oxidation of the pattern forming surface Wa can be suppressed or prevented more reliably.

The rinse liquid and the IPA are expelled from the peripheral edge portion of the substrate W. The rinse liquid and the IPA expelled from the peripheral edge portion of the substrate W are received by an inner wall of the second guard 84, flow down along the inner wall of the second guard 84, and are received by the second cup 82. In the replacing step (step S8 of FIG. 7), the solvent drain valve 92 is opened in the state where the solvent recovery valve 91 and the filler drain valve 93 are closed. The rinse liquid and the IPA received by the second cup 82 are thereby guided via the piping 87 to the solvent drain piping 89. A reason why the liquid received by the second cup 82 is drained is because this liquid contains not just IPA but also a large amount of the rinse liquid.

Figure 8H:
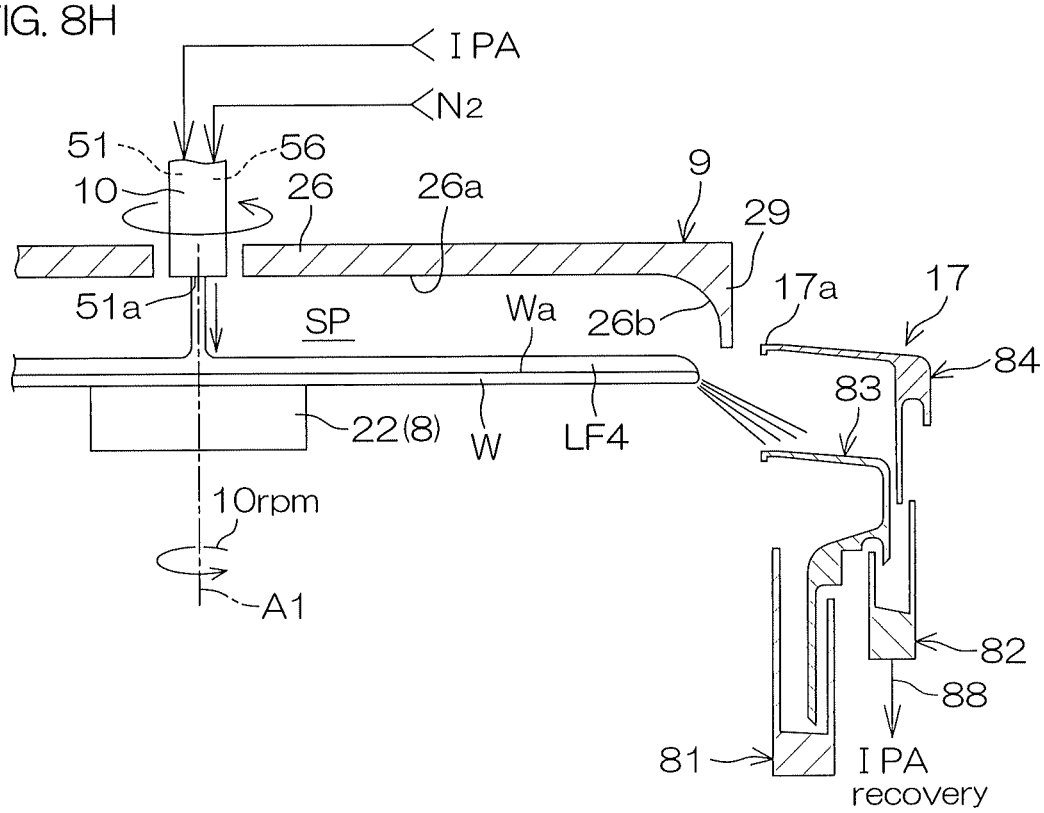
FIG. 8H is an illustrative view for describing a step subsequent to that of FIG. 8G.
Figure 8:
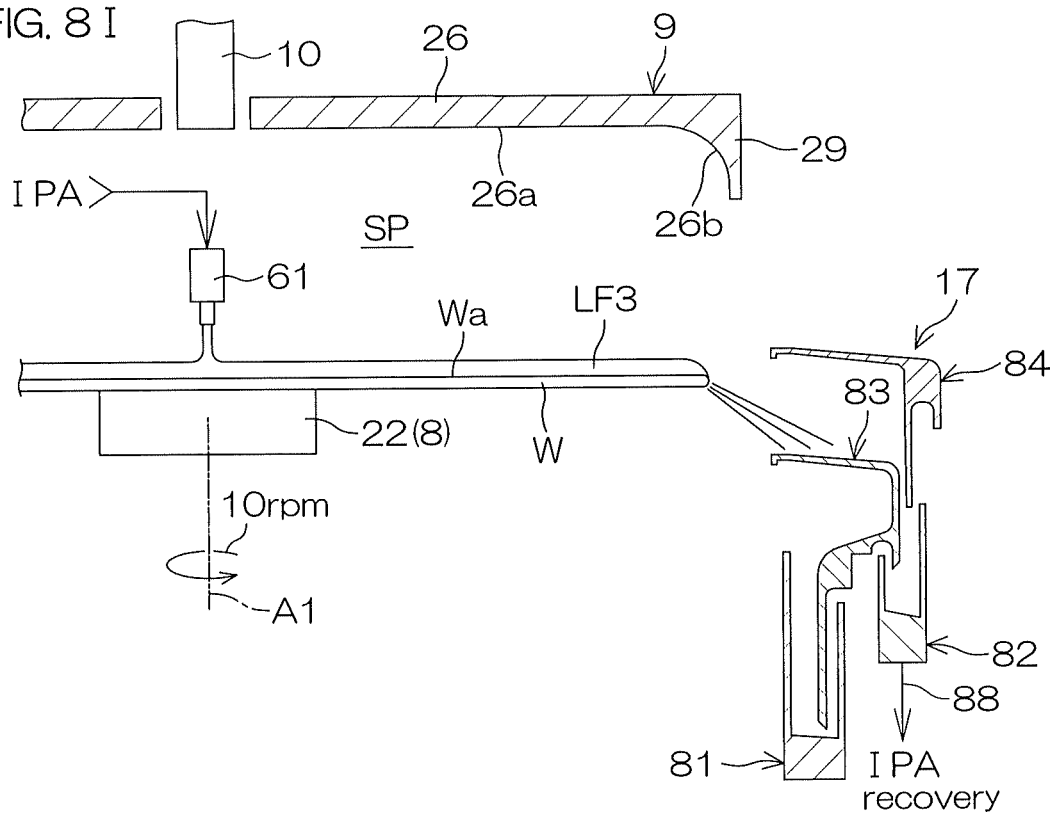
FIG. 8A is an illustrative view for describing the substrate processing example.
FIG. 8B is an illustrative view for describing a step subsequent to that of FIG. 8A.
FIG. 8C is an illustrative view for describing a step subsequent to that of FIG. 8B.
FIG. 8D is an illustrative view for describing a step subsequent to that of FIG. 8C.
FIG. 8E is an illustrative view for describing a step subsequent to that of FIG. 8D.
FIG. 8F is an illustrative view for describing a step subsequent to that of FIG. 8E.
FIG. 8I is an illustrative view for describing a step subsequent to that of FIG. 8H.
FIG. 8J is an illustrative view for describing a step subsequent to that of FIG. 8I.
FIG. 8K is an illustrative view for describing a step subsequent to that of FIG. 8J.
FIG. 8L is an illustrative view for describing a step subsequent to that of FIG. 8K.
FIG. 8M is an illustrative view for describing a step subsequent to that of FIG. 8L.
FIG. 8N is an illustrative view for describing a step subsequent to that of FIG. 8M.
FIG. 8O is an illustrative view for describing a step subsequent to that of FIG. 8N.

When a predetermined period (a period sufficient for the liquid film to be replaced completely with the IPA) elapses from start of discharge of the IPA, the controller 4 controls the blocking member elevating/lowering unit 33 to elevate the blocking member 9 toward an intermediate position that is set higher than the lower position and lower than the upper position and maintains it at the intermediate position as shown in FIG. 8H (intermediate position disposing step). The intermediate position is a height position of the blocking member 9 such that the lower end of the cylindrical circular portion 29 of the blocking member 9 would be at the same height position as an upper end of the second guard 84 that is positioned at the upper position. Also, the controller 4 closes the solvent drain valve 92 and opens the solvent recovery valve 91. A flow destination of the piping 87 is thereby switched to the solvent recovery piping 88. Also, the controller 4 controls the blocking plate rotating unit 32 to accelerate the blocking member 9 (blocking plate 26) that is positioned at the intermediate position to a predetermined high speed (for example, of 500 rpm).

In the replacing step (step S8 of FIG. 7) that is executed in the state in which the blocking member 9 is positioned at the lower position, the IPA sometimes becomes attached to the circular cylindrical portion 29. The IPA attached to the circular cylindrical portion 29 can be spun off by rotating the blocking plate 26 at high speed with the blocking member 9 being positioned at the intermediate position.

Also, the upper end 17a of the processing cup 17 (that is, the upper end of the second guard 84 positioned at the upper position) is provided at the same height as the lower end of the circular cylindrical portion 29 of the blocking member 9 (blocking plate 26) positioned at the intermediate position. The IPA spun off from the circular cylindrical portion 29 by rotation of the blocking member 9 can thus be captured satisfactorily by the processing cup 17.

The IPA is expelled from the peripheral edge portion of the substrate W. The IPA expelled from the peripheral edge portion of the substrate W is received by the inner wall of the second guard 84, flows down along the inner wall of the second guard 84, and is guided to the solvent recovery piping 88 via the second cup 82 and the piping 87.

When a predetermined period elapses from elevation of the blocking member 9, the controller 4 controls the blocking member elevating/lowering unit 33 to elevate the blocking member 9 toward the upper position from the intermediate position as shown in FIG. 8I (blocking member elevating step). After being elevated to the upper position, the blocking member 9 is maintained at the upper position. Also, the controller 4 closes the solvent valve 53 and the inert gas valve 58. The discharges of the IPA and the inert gas from the central nozzle 10 are thereby stopped. Also, the controller 4 controls the blocking plate rotating unit 32 to stop rotation of the blocking plate 26. Also, the controller 4 closes the solvent recovery valve 91 and opens the filler drain valve 93. The flow destination of the piping 87 is thereby switched to the filler drain piping 90.

By the blocking member 9 being elevated from the intermediate position, a blocked state of the internal space SP is released. The elevation of the blocking member 9 (release of the blocked state) is performed in a state where the pattern forming surface Wa is covered with the liquid film LF3 of the IPA. That is, the blocked state of the internal space SP is released while protecting the pattern forming surface Wa by the liquid film LF3 of the IPA. The oxidation of the pattern forming surface Wa thereafter can thereby be suppressed or prevented reliably.

Also, the controller 4 controls the nozzle moving unit 63 to make the solvent nozzle 61 enter between the substrate facing surface 26a of the blocking member 9 positioned at the upper position and the pattern forming surface Wa and dispose the solvent nozzle 61 at a position facing the central portion of the pattern forming surface Wa as shown in FIG. 8I. After the solvent nozzle 61 is disposed at the position facing the central portion of the pattern forming surface Wa, the controller 4 opens the solvent valve 65. The solvent is thereby discharged from the solvent nozzle 61 as shown in FIG. 8I.

After the blocking member 9 is raised, the solvent from the solvent nozzle 61 is supplied, in place of the solvent from the central nozzle 10, to the pattern forming surface Wa. Consequently, the liquid film LF3 of the IPA is maintained satisfactorily on the pattern forming surface Wa. That is, the pattern forming surface Wa continues to be covered by the IPA. Therefore, even after the elevation of the blocking member 9, exhaustion of supplying of the IPA onto the pattern forming surface Wa will not occur.

The IPA is expelled from the peripheral edge portion of the substrate W. The IPA expelled from the peripheral edge portion of the substrate W is received by the inner wall of the second guard 84, flows down along the inner wall of the second guard 84, and is guided to the solvent recovery piping 88 via the second cup 82 and the piping 87.

When a predetermined period elapses from start of discharge of the solvent from the solvent nozzle 61, the controller 4 closes the solvent valve 65. The replacing step (step S8 of FIG. 7) thereby ends. The controller 4 controls the nozzle moving unit 63 to return the solvent nozzle 61 to the retreat position.

Next, the controller 4 executes the filler coating step (step S9 of FIG. 7) of coating the filler onto the pattern forming surface Wa. The filler coating step (step S9 of FIG. 7) includes a filler discharging step and a filler spreading step.

Figure 8J:
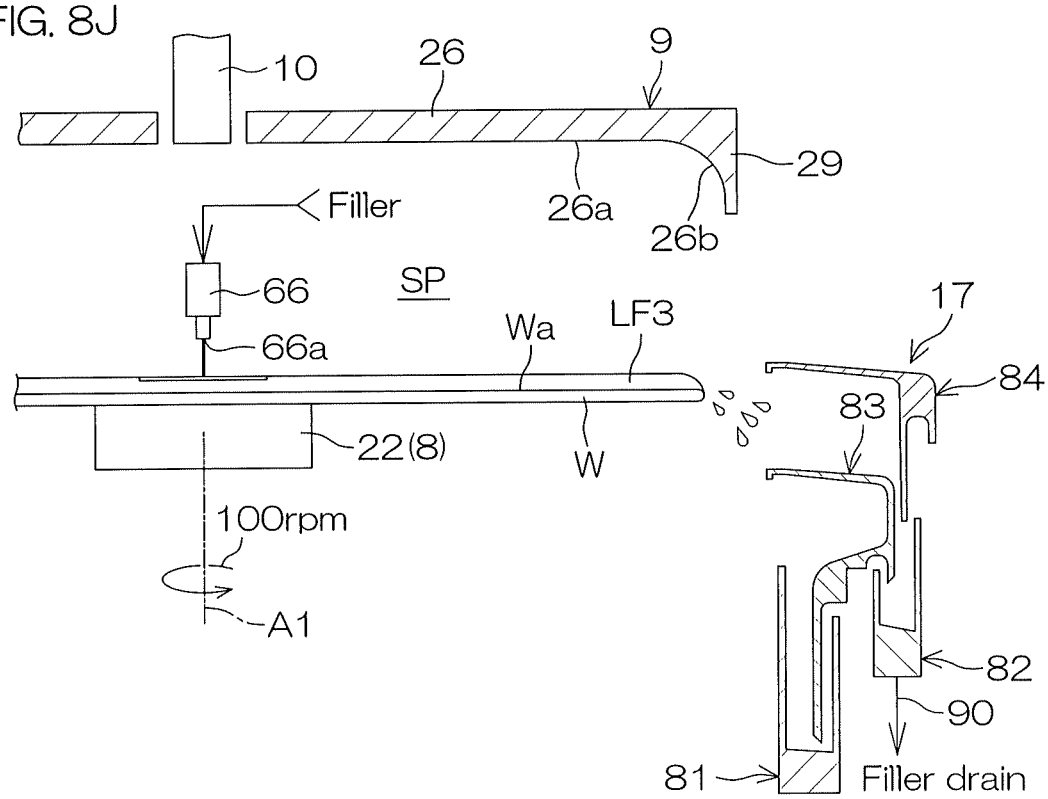

Specifically, immediately after end of the replacing step (step S8 of FIG. 7), the controller 4 controls the nozzle moving unit 68 to make the filler nozzle 66 enter between the substrate facing surface 26a of the blocking member 9 positioned at the upper position and the pattern forming surface Wa and dispose the filler nozzle 66 at a position facing the central portion of the pattern forming surface Wa as shown in FIG. 8J. Also, the controller 4 controls the spin motor 23 to make the substrate W rotate at a filler core speed (500 to 200 rpm; for example, 100 rpm) that enables forming of a filler core at the central portion of the substrate W and maintain it at the filler core speed. Here, a filler core refers to a circular liquid pool smaller than a diameter of the substrate W that the filler supplied to the pattern forming surface Wa of the substrate W forms at the central portion (especially in a vicinity of a rotation center) of the substrate W. After the filler nozzle 66 is disposed at the position facing the central portion of the pattern forming surface Wa, the controller 4 opens the filler valve 70 to discharge the liquid filler (polymer) from the discharge port 66a of the filler nozzle 66 toward the central portion of the pattern forming surface Wa as shown in FIG. 8J (filler discharging step).

The polymer contained in the filler is expensive. Also, among the filler supplied to the pattern forming surface Wa, the filler that is not used for filling between the structural bodies 101 of the patterns 100 is drained (discarded). Due to the above, the filler supplied to the pattern forming surface Wa is preferably as low in amount as possible. In the present substrate processing example, a discharge flow rate of the filler (polymer) from the filler nozzle 66 is, for example, 0.8 milliliters/minute and is therefore extremely low. That is, the discharge flow rate of the filler from the filler nozzle 66 in the filler discharging step is less than a supply flow rate of the hydrofluoric acid to the pattern forming surface Wa in the chemical liquid processing step (step S4 of FIG. 7), a supply flow rate of the rinse liquid to the pattern forming surface Wa in the rinse liquid processing step (step S5 of FIG. 7), and a supply flow rate of the IPA to the pattern forming surface Wa in the replacing step (step S8 of FIG. 7). Also, a total supply amount that is an integral of the discharge flow rate is, for example, 0.8 to 5.0 milliliters and is therefore a small amount. The filler discharged from the filler nozzle 66 is retained in a vicinity of a rotation center of an upper surface of the liquid film LF3 of the IPA that is sufficiently thick in film thickness.

Immediately after end of the filler discharging step, the controller 4 controls the spin motor 23 to accelerate the rotation of the substrate W to a highspeed (within a range of 1500 to 3000 rpm; for example, 2500 rpm) and keep it at the high speed (high speed rotating step). The high speed is a rotational speed that is higher than the rotational speed of the substrate W in each of step S4 to step S8. By the rotation of the substrate W at the high speed, the filler that was retained in the vicinity of the rotation center of the upper surface of the liquid film LF3 of the IPA until then receives the centrifugal force due to the rotation of the substrate W and spreads across the entirety of the pattern forming surface Wa (filler spreading step). Consequently, a liquid film LF4 of the filler is laminated on the upper surface of the liquid film LF3 of the IPA on the pattern forming surface Wa as shown in FIG. 8K. The rotation of the substrate W at the high speed may be performed in parallel to the filler discharging step.

The IPA and the filler (mainly the IPA) splash laterally from the peripheral edge portion of the substrate W. The IPA and the filler that splashed from the peripheral edge portion of the substrate Ware received by the inner wall of the second guard 84, flow down along the inner wall of the second guard 84, and are guided to the filler drain piping 90 via the second cup 82 and the piping 87.

When a predetermined period (for example, of 2 to 3 seconds) elapses from start of acceleration of the substrate W, the filler spreading step ends and the filler coating step (step S9 of FIG. 7) thereby ends.

Immediately after end of the filler coating step (step S9 of FIG. 7), the controller 4 controls the spin motor 23 to control the rotation of the substrate W to a first spin-off speed (within a range of 500 to 2000 rpm; for example, 2000 rpm) and keep it at the first spin-off speed as shown in FIG. 8L (step S10 of FIG. 7; first spin-off step).

In the first spin-off step (step S10 of FIG. 7), excess filler is spun off and removed from the pattern forming surface Wa by the substrate W being rotated at the first spin-off speed. A thickness of the liquid film LF4 of the filler is thereby adjusted to a desired thickness.

The IPA and the filler splash laterally from the peripheral edge portion of the substrate W. The IPA and the filler that splashed from the peripheral edge portion of the substrate Ware received by the inner wall of the second guard 84, flow down along the inner wall of the second guard 84, and are guided to the filler drain piping 90 via the second cup 82 and the piping 87.

When a predetermined period elapses from start of the first spin-off step (step S10 of FIG. 7), the first spin-off step (step S10 of FIG. 7) ends.

Figure 8M:
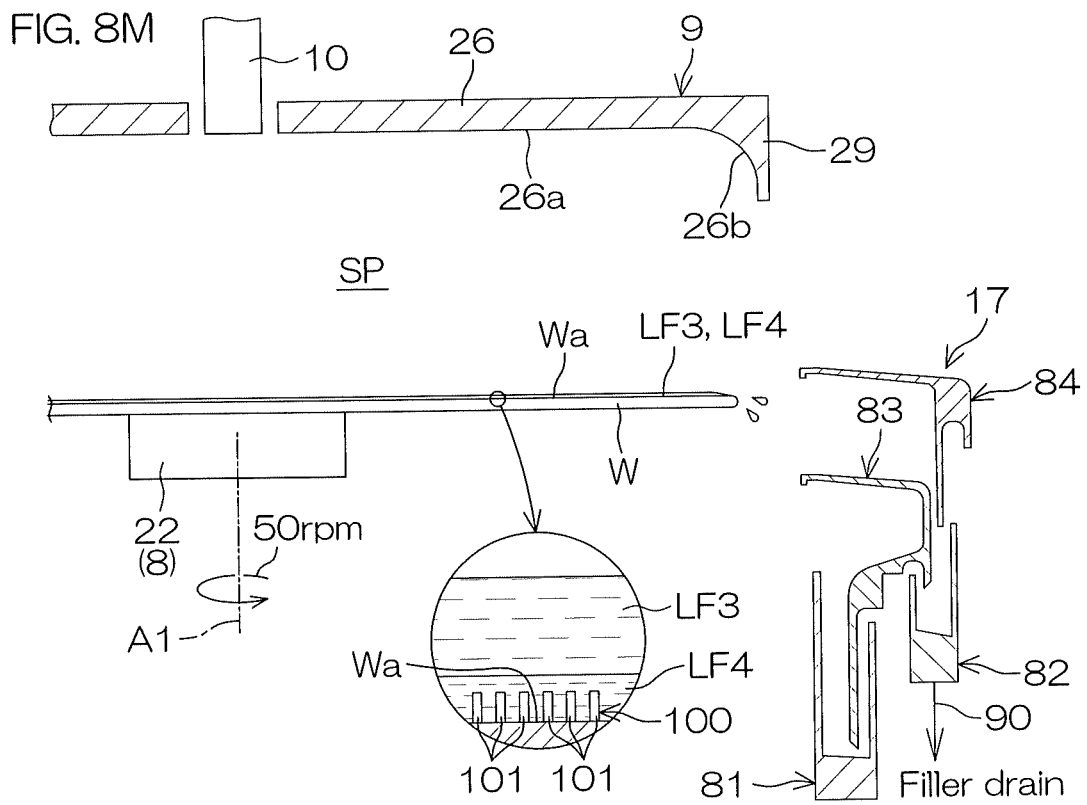

Next, a filler settling step (step S11 of FIG. 7) for making the filler that is spread across the entirety of the pattern forming surface Wa settle is executed. Specifically, the controller 4 controls the spin motor 23 to decrease the rotational speed of the substrate W to a low speed (of not more than 100 rpm; for example, 10 rpm) and keep it at the low speed. Thereby, the substrate W rotates at the low speed. By the rotational speed of the substrate W being decreased greatly, the centrifugal force acting on the substrate W decreases. Then, due to a difference in specific gravity between the filler and the IPA, the filler present on the upper surface of the liquid film LF3 of the IPA settles. Thereby, the liquid film LF4 of the filler settles and, as shown in FIG. 8M, the patterns 100 formed on the pattern forming surface Wa become covered with the liquid film LF4 of the filler. Recesses between mutually adjacent structural bodies 101 in the patterns 100 then become filled with the filler.

When a predetermined period (a period sufficient for the filler to fill between the mutually adjacent structural bodies 101 in the patterns 100) elapses from start of deceleration of the substrate W, the filler settling step (step S11 of FIG. 7) ends. Next, a second spin-off step (step S12 of FIG. 7) for adjusting the thickness of the liquid film LF4 of the filler is executed.

Figure 8N:
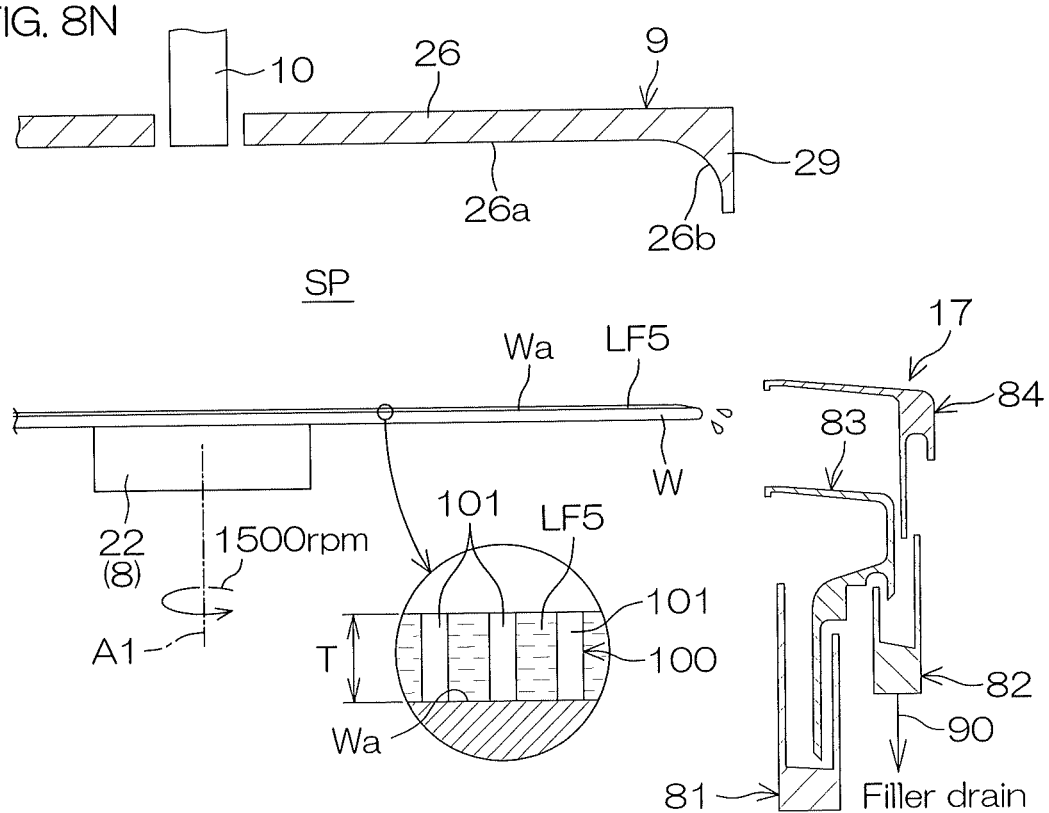

Specifically, in the second spin-off step (step S12 of FIG. 7), the controller 4 controls the spin motor 23 to accelerate the rotation of the substrate W to a second spin-off speed (within a range of 500 to 2500 rpm; for example, 1500 rpm) and keep it at the second spin-off speed. The substrate W is rotated at high speed. The IPA and the excess filler present on the pattern forming surface Wa are thereby spun off. Consequently, the recesses between mutually adjacent structural bodies 101 in the patterns 100 become filled with a liquid film LF5 of the filler having a thickness approximately equal to the film thickness T of the patterns 100 (structural bodies 101) as shown in FIG. 8N. In the second spin-off step (step S12 of FIG. 7), the pattern forming surface Wa is dried by the liquids (IPA and excess filler) being removed from the pattern forming surface Wa.

The IPA and the filler that splashed from the peripheral edge portion of the substrate Ware received by the inner wall of the second guard 84, flow down along the inner wall of the second guard 84, and are guided to the filler drain piping 90 via the second cup 82 and the piping 87.

When a predetermined period elapses from start of acceleration of the substrate W, the controller 4 controls the spin motor 23 to stop the rotation of the substrate W by the spin chuck 8 (step S13 of FIG. 7). Also, the controller 4 controls the guard elevating/lowering unit 85 to lower the second guard 84 to the lower position.

Thereafter, the substrate W is carried out from inside the chamber 7 of the liquid processing unit 6A (step S14 of FIG. 7). Specifically, the controller 4 makes the hand of the second transfer robot CR2 enter into the interior of the chamber 7. The controller 4 then releases suction of the substrate W by the spin chuck 8 and makes the substrate W on the spin chuck 8 be held by the hand of the second transfer robot CR2. Thereafter, the controller 4 makes the hand of the second transfer robot CR2 retreat from inside the chamber 7. The liquid-processed substrate W is thereby carried out from the chamber 7 of the liquid processing unit 6A. A state of the chamber 7 after carry-out of the substrate W is shown in FIG. 8O.

The substrate W unloaded from the liquid processing unit 6A is then subject to the substrate heating processing in the baking unit 6B.

Figure 9:
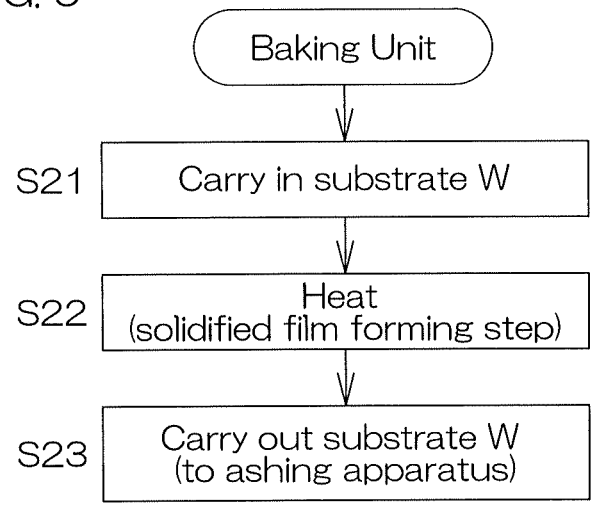
FIG. 9 is a flowchart for describing contents of a substrate processing example executed in the baking unit.

FIG. 9 is a flowchart for describing contents of a substrate processing example executed in the baking unit 6B.

The processing (heating processing) of the substrate W by the baking unit 6B shall now be described with reference to FIG. 1, FIG. 4, and FIG. 9. When the heating processing by the baking unit 6B is executed, the substrate W after being liquid processed by the liquid processing unit 6A is carried into an interior of the chamber 111 (step S21 of FIG. 9). Prior to carry-in of the substrate W into the baking unit 6B, the controller 4 moves a shutter to an open position. A carry-in/carry-out port is thereby opened. Also, prior to the carry-in of the substrate W into the baking unit 6B, the controller 4 controls the lift pin elevating/lowering unit 117 to dispose the lift pins 115 at positions at which tips thereof project above the hot plate 112.

Specifically, the controller 4 makes the hand of the first transfer robot CR1 that holds the substrate W enter into the interior of the chamber 111. Thereby, the substrate W is transferred to the elevating/lowering unit 114 in the state where its pattern forming surface Wa is faced upward. The substrate W carried into the chamber 111 is placed on the lift pins 115 by the hand. Thereafter, the controller 4 controls the lift pin elevating/lowering unit 117 to lower the lift pins 115 to lower positions. By this lowering of the lift pins 115, the substrate W on the lift pins 115 is transferred onto the hot plate 112. The substrate W is then held by the hot plate 112 by a frictional force arising between the lower surface of the substrate W and the upper surface 112a of the hot plate 112.

After placing the substrate W on the lift pins 115, the controller 4 makes the hand retreat from inside the chamber 111. After the hand retreats from inside the chamber 111, the controller 4 moves the shutter to a closed position and thereby, the carry-in/carry-out port is sealed by the shutter and the interior of the chamber 111 becomes a sealed space.

After the interior of the chamber 111 is sealed, the controller 4 controls the built-in heater 113 to start heating of the substrate W from the lower surface side and heat the substrate W with a predetermined heating temperature. The liquid film LF5 of the filler (see FIG. 8N) thereby solidifies and the solidified film SF of the filler (see FIG. 4) is formed.

When a predetermined heating period elapses from start of heating of the substrate W, the controller 4 controls the lift pin elevating/lowering unit 117 to elevate the lift pins 115 to upper positions at which the substrate W is separated from the hot plate 112. By elevation of the lift pins 115, the substrate W that was supported by the hot plate 112 until then is supported by the lift pins 115. Thereafter, the controller 4 disposes the shutter at the open position and the carry-in/carry-out port is thereby opened. In this state, the substrate W supported by the lift pins 115 is carried out from the chamber 111 by the first transfer robot CR1 (step S23 of FIG. 9).

The first transfer robot CR1 transfers the substrate W carried out from the baking unit 6B to the indexer robot IR. The indexer robot IR houses the received substrate W in a substrate container C of a load port LP.

The heating processed substrate W is transferred to an ashing apparatus (filler removing apparatus) external to the substrate processing apparatus 1 and in the ashing apparatus, the filler is removed from the pattern forming surface Wa, for example, by dry etch, etc. As a method for removing the filler besides this, for example, sublimation of the filler as in Japanese Patent Application Publication No. 2013-258272 and removal of the filler by plasma processing, etc., as in Japanese Patent Application Publication No. 2011-124313 can be cited as examples.

As described above, according to the present preferred embodiment, the blocking member 9 is provided with the circular cylindrical portion 29 and therefore, in the state where the blocking member 9 is positioned at the lower position, the atmosphere of the internal space SP and the atmosphere of the space outside the internal space SP can be substantially blocked from each other. In this case, the internal space SP formed between the substrate W and the blocking member 9 positioned at the lower position can be maintained in a state of low oxygen concentration.

Then, with the blocking member 9 being positioned at the lower position, the chemical liquid processing using the hydrofluoric acid is performed. By starting the chemical liquid processing using the hydrofluoric acid after sufficiently decreasing the oxygen concentration in the internal space SP, the chemical liquid processing using the hydrofluoric acid can be applied to the pattern forming surface Wa under an atmosphere of low oxygen concentration. The oxidation of the pattern forming surface Wa in the chemical liquid processing step (step S4 of FIG. 7) can thereby be suppressed or prevented.

Also, the rinsing step (step S5 of FIG. 7), the puddle rinsing step (step S6 of FIG. 7), and the liquid retaining step (step S7 of FIG. 7) are performed with the blocking member 9 being positioned at the lower position. Further, the replacing step (step S8 of FIG. 7) is performed with the blocking member 9 being positioned at the lower position. The oxidation of the pattern forming surface Wa can thereby be suppressed or prevented in the respective steps from the rinsing step (step S5 of FIG. 7) to the replacing step (step S8 of FIG. 7).

Also, the filler is discharged toward the pattern forming surface Wa in the state where the blocking member 9 is positioned at the upper position. The filler is thereby supplied to the pattern forming surface Wa and the liquid film LF4 or LF5 of the filler is formed on the pattern forming surface Wa. Thereafter, the solidified film SF of the filler is formed by the liquid film LF5 of the filler being solidified.

If the filler is discharged toward the pattern forming surface Wa from a central portion discharge port (discharge port formed at a lower end of the central nozzle 10) of the blocking member 9 that is positioned at the lower position, the filler that splashes from the peripheral edge portion of the substrate W upon receiving the centrifugal force due to rotation of the substrate W may hit (collide against) the circular cylindrical portion 29 of the blocking member 9 and be resupplied to the pattern forming surface Wa. If the filler is resupplied to the pattern forming surface, turbulence may arise in the filler present on the pattern forming surface Wa and it may not be possible to form the liquid film LF4 or LF5 of the filler satisfactorily (for example, to a uniform thickness). In this case, a defect may arise in the substrate W after removal of the solidified film.

On the other hand, with the present preferred embodiment, the spreading of the filler on the pattern forming surface Wa is started in the state where the blocking member 9 is positioned at the upper position. In the state where the blocking member 9 is positioned at the upper position, the lower end of the circular cylindrical portion 29 is positioned higher than the pattern forming surface Wa. Therefore, the filler that splashes from the peripheral edge portion of the substrate W can be suppressed or prevented from hitting the circular cylindrical portion 29 of the blocking member 9 and being resupplied to the pattern forming surface. Arising of turbulence in the filler present on the pattern forming surface Wa can thus be suppressed or prevented. The liquid film LF4 or LF5 of the filler can thereby be formed satisfactorily (for example, to a uniform thickness) and arising of a defect in the substrate after removal of the solidified film can be suppressed.

Also, with the present preferred embodiment, the elevation of the blocking member 9 is started in the state where the pattern forming surface Wa is covered with the liquid film LF3 of the IPA. That is, the blocked state of the internal space SP is released while protecting the pattern forming surface Wa by the liquid film LF3 of the IPA. The pattern forming surface Wa is protected by the liquid film (liquid film LF3 of the IPA or liquid film LF4 or LF5 of the filler) even after the release of the blocked state. The oxidation of the pattern forming surface Wa in accompaniment with the release of the blocked state of the internal space SP can thus be suppressed or prevented reliably. That is, the oxidation of the pattern forming surface Wa in a transition process from the replacing step (step S8 of FIG. 7) to the filler coating step can be suppressed or prevented satisfactorily.

Also, in the filler coating step (step S9 of FIG. 7), the filler nozzle 66 is disposed between the substrate W and the blocking member 9 positioned at the upper position. Also, the filler is discharged toward the pattern forming surface Wa not from a central portion discharge port of the central nozzle 10 but from the discharge port 66a of the filler nozzle 66. At this point, a distance in the vertical direction with respect to the discharge port 66a of the filler nozzle 66 is shorter than a distance in the vertical direction between a central portion discharge port of the central nozzle 10 and the pattern forming surface Wa in the chemical liquid processing step (step S4 of FIG. 7).

As a distance in the vertical direction between a discharge port and the pattern forming surface Wa increases, time until the filler discharged from the discharge port reaches the pattern forming surface Wa increases. Therefore, if the distance in the vertical direction between the discharge port and the pattern forming surface Wa is long, a liquid stream of the discharged filler is easily influenced by external disturbance. Therefore, if, for instance, the filler is discharged toward the pattern forming surface Wa from a central portion discharge port of the blocking member 9 positioned at the upper position in the filler coating step (step S9 of FIG. 7), it is sometimes difficult to make the filler land on an intended liquid landing position of the pattern forming surface Wa at an intended liquid landing flow rate. In this case, it may not be possible to supply (coat) the pattern forming surface Wa with the filler satisfactorily.

In addition, in the present substrate processing example, the discharge flow rate of the filler from the filler nozzle 66 in the filler coating step (step S8 of FIG. 7) is low. Therefore, if, for instance, the filler is discharged not from the discharge port 66a of the filler nozzle 66 but from a central portion discharge port of the blocking member 9, the filler discharged from the central portion discharge port of the blocking member 9 is strongly influenced by external disturbance in some cases. In this case, the filler supplied to the pattern forming surface Wa may not be of a continuous flow but may be intermittent or the filler may land on a position deviated from the intended liquid landing position. In addition, in the present substrate processing example, the substrate W is rotated at high speed to spread the filler supplied to the pattern forming surface Wa (filler spreading step). A strong air stream may be generated between the substrate W and the blocking member 9 due to the high speed rotation of the substrate W and this air stream may influence the filler as an external disturbance.

On the other hand, with the present preferred embodiment, the distance in the vertical direction with respect to the pattern forming surface Wa is short and therefore a mode of discharge of the filler discharged from the discharge port 66a of the filler nozzle 66 can be stabilized while suppressing influence of the air stream or other external disturbance on the filler to a minimum. The pattern forming surface Wa can thereby be supplied (coated) with the filler satisfactorily. A satisfactory solidified film SF can thus be formed on the pattern forming surface Wa.

Figure 10:
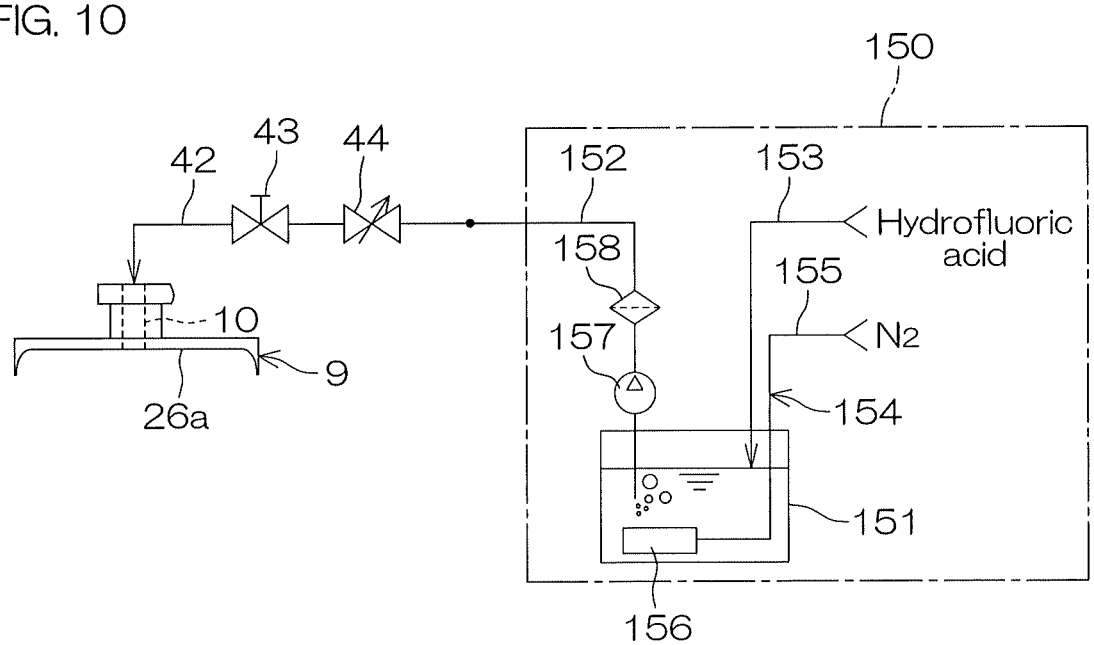
FIG. 10 is a diagram of a specific configuration of a chemical liquid supplying portion shown in FIG. 2.

FIG. 10 is a diagram of a specific configuration of the chemical liquid supplying portion 150. The chemical liquid supplying portion 150 includes a chemical liquid tank 151, a chemical liquid delivery piping 152, a chemical liquid supply piping 153, and an inert gas dissolving unit 154.

The chemical liquid tank 151 stores the chemical liquid (hydrofluoric acid), such as the hydrofluoric acid. The chemical liquid delivery piping 152 is a piping connected to an upstream end of the chemical liquid piping 42 (see FIG. 2) and guides the chemical liquid stored in the chemical liquid tank 151 to the chemical liquid piping 42. The chemical liquid supply piping 153 supplies fresh chemical liquid (and/or recovered chemical liquid) to the chemical liquid tank 151. The inert gas dissolving unit 154 supplies an inert gas to the chemical liquid inside the chemical liquid tank 151 and makes the inert gas be dissolved in the hydrofluoric acid. The inert gas dissolving unit 154 is an example of a dissolved oxygen amount reducing unit.

A liquid feeding pump 157 configured to feed out the chemical liquid inside the chemical liquid tank 151 to the chemical liquid piping 42 and a filter 158 that removes foreign matter inside the chemical liquid flowing through the chemical liquid delivery piping 152 are interposed in the chemical liquid delivery piping 152.

The inert gas dissolving unit 154 includes an inert gas piping 155 supplied with the inert gas from an inert gas supply source. The inert gas piping 155 includes a bubbling piping 156 that discharges the inert gas from a large number of discharge ports disposed inside the chemical liquid to generate bubbles inside the chemical liquid.

An amount of oxygen dissolved in the chemical liquid is called the dissolved oxygen amount. A concentration of oxygen in the chemical liquid is called the dissolved oxygen concentration. When the dissolved oxygen amount is reduced, the dissolved oxygen concentration is also reduced. By dissolving the inert gas in the hydrofluoric acid, the dissolved oxygen can be degassed from the chemical liquid inside the chemical liquid tank 151 and the chemical liquid inside the chemical liquid tank 151 can be kept in a state of being reduced in dissolved oxygen amount. The chemical liquid supplied to the central nozzle 10 from the chemical liquid supplying portion 150 via the chemical liquid piping 42 can thereby be made a chemical liquid that is reduced in dissolved oxygen amount. The chemical liquid (hydrofluoric acid) that is reduced in dissolved oxygen amount can thus be supplied to the pattern forming surface Wa.

By the above, the oxidation of the pattern forming surface Wa can be suppressed or prevented before forming of the solidified film SF and the filler can be supplied smoothly to the pattern forming surface Wa.

Figure 11:
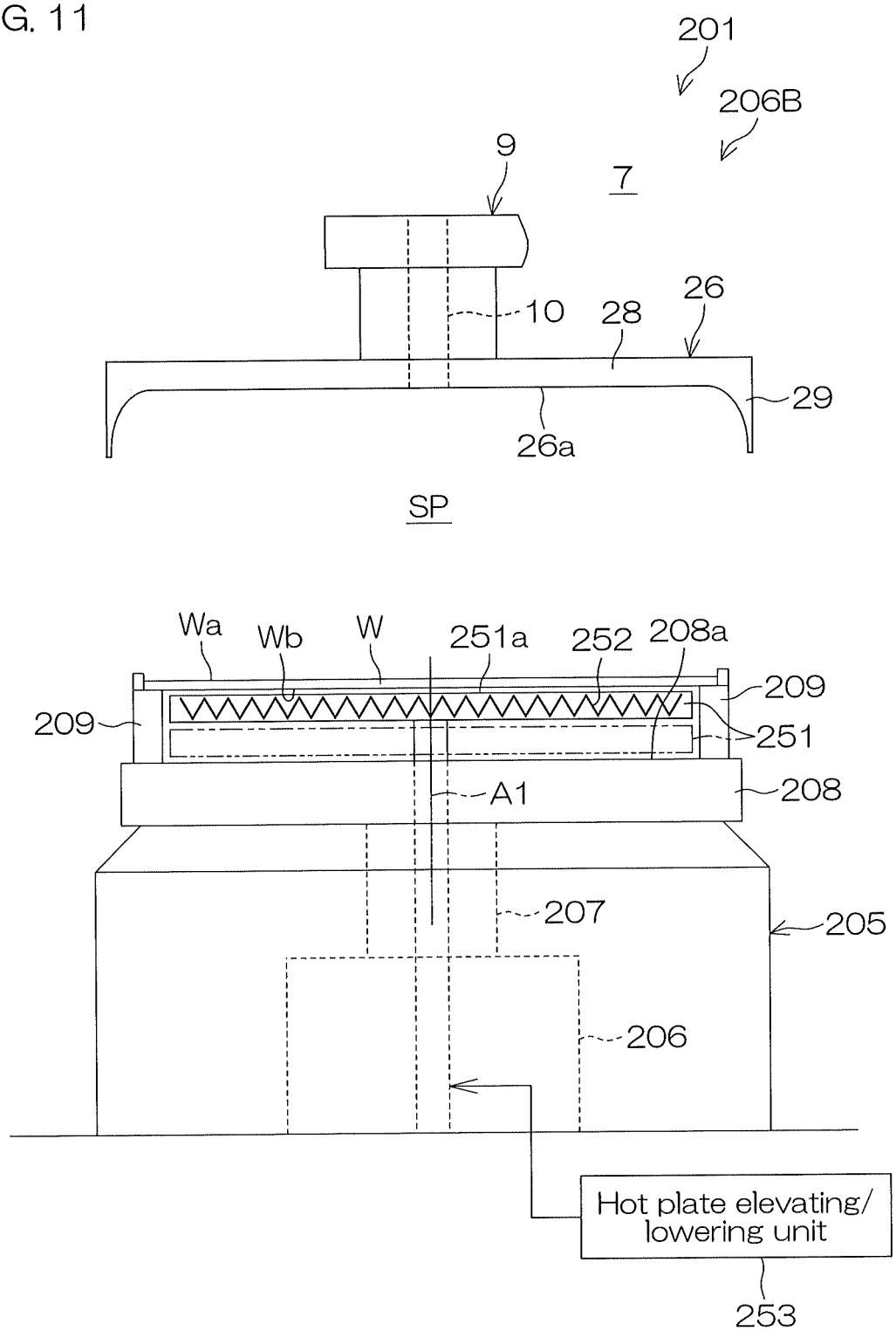
FIG. 11 is an illustrative view for describing a configuration example of a liquid processing unit according to a second preferred embodiment.

FIG. 11 is an illustrative view for describing a configuration example of a liquid processing unit 206B according to a second preferred embodiment. With the second preferred embodiment, portions in common to the first preferred embodiment described above shall respectively be provided with the same reference symbols as in the case of FIG. 1 to FIG. 10 and description thereof shall be omitted.

Main points by which a substrate processing apparatus 201 according to the second preferred embodiment differs from the substrate processing apparatus 1 are that a hot plate (solidified film forming unit) 251 is provided in the interior of the chamber 7 of the liquid processing unit 206B and that the liquid film LF5 of the filler is solidified to form the solidified film SF of the filler by heating of the substrate W by the hot plate 251. These shall be described specifically below.

As the substrate holding unit, a clamping type spin chuck 205 that clamps the substrate W in the horizontal direction to hold the substrate W horizontally is adopted. Specifically, the spin chuck 205 includes a spin motor 206, a spin shaft 207 made integral to a drive shaft of the spin motor 206, and a disk-shaped spin base 208 mounted substantially horizontally to an upper end of the spin shaft 207.

The spin base 208 includes a horizontal, circular upper surface 208a having an outer diameter larger than the outer diameter of the substrate W. On the upper surface 208a, a plurality (not less than three; for example, six) of clamping members 209 are disposed at a peripheral edge portion thereof. At the peripheral edge portion of the upper surface 208a, the plurality of clamping members 209 are disposed at suitable intervals, for example, at equal intervals on a circumference corresponding to an outer peripheral shape of the substrate W.

The hot plate 251 is opposingly disposed below a lower side of the rear surface (surface at the opposite side to the pattern forming surface Wa) Wb of the substrate W. A built-in heater 252 is incorporated in the hot plate 251. The built-in heater 252 is a heater that generates Joule heat and, for example, is a heating wire that generates heat upon being supplied with current. The hot plate 251 is disposed above the spin base 208 and below the substrate W held by the clamping members 209. The hot plate 251 has a horizontal upper surface 251a facing an entirety of the rear surface Wb of the substrate W. The hot plate 251 does not rotate even when the spin chuck 205 rotates. A temperature of the hot plate 251 is changed by the controller 4. A temperature of the upper surface 251a of the hot plate 251 is uniform within the surface. By the controller 4 increasing the temperature of the upper surface 251a of the hot plate 251, the entirety of the pattern forming surface Wa is heated uniformly by radiant heat from the hot plate 251.

A hot plate elevating/lowering unit 253 configured to elevate and lower the hot plate 251 as it is in a horizontal orientation is coupled to the hot plate 251. The hot plate elevating/lowering unit 253 is configured, for example, from a ball screw, a motor, etc. By elevation and lowering of the hot plate 251, an interval between the upper surface 251a and the lower surface of the substrate W is changed. Also, the hot plate elevating/lowering unit 253 is capable of holding the hot plate 251 at each height position.

A heating processing is applied by the hot plate 251 to the substrate W with which the liquid film LF5 of the filler (see FIG. 8N) is formed on the pattern forming surface Wa.

Specifically, the controller 4 controls the hot plate elevating/lowering unit 253 to dispose the hot plate 251 that is already in a high temperature state due to heat generation by the built-in heater 252 at an upper position (position indicated by solid lines in FIG. 11). In a state where the hot plate 251 is disposed at the upper position, the radiant heat from the hot plate 251 reaches the substrate W and the substrate W is heated with a predetermined heating temperature. Thereby, the liquid film LF5 of the filler solidifies and the filler supplied to the pattern forming surface Wa on which the solidified film SF of the filler is to be formed can be solidified to form the solidified film SF of the filler (solidified film forming step).

When a predetermined heating period elapses from start of heating of the substrate W, the controller 4 lowers the hot plate 251 from the upper position to a lower position (position indicated by alternate long and two short dashed line in FIG. 11). In a state where the hot plate 251 is disposed at the lower position, the radiant heat from the hot plate 251 hardly reaches the substrate W and the substrate W is not heated by the hot plate 251.

According to the second preferred embodiment, the following actions and effects are exhibited in addition to those of the first preferred embodiment.

That is, the forming of the liquid film LF5 of the filler on the pattern forming surface Wa and the solidifying of the liquid film LF5 of the filler are performed in the chamber 7 in common and there is thus no need to transfer the substrate W among a plurality of chambers. A processing time for one substrate W can thus be shortened and consequently, improvement of throughput of processing can be achieved.

Also, with the pattern forming surface Wa after forming of the liquid film LF5 of the filler, the solidifying of the filler is not finished. Therefore, a possibility of the liquid filler dropping from the pattern forming surface Wa during transfer of the substrate W among a plurality of chambers cannot be eliminated completely. In this case, the transfer chamber 5 may be contaminated by the filler. With the present preferred embodiment, there is no need to transfer the substrate W among a plurality of chambers and there is thus no concern of such contamination of the transfer chamber 5.

Further, if the (polymer contained in the) filler has a property of being sublimable by heating, the filler contained in the solidified film SF of the filler formed on the pattern forming surface Wa may be removed from the pattern forming surface Wa by sublimating it by heating of the substrate W by the hot plate 251.

In this case, a heating processing is applied by the hot plate 251 to the substrate W with which the solidified film SF of the filler is formed on the pattern forming surface Wa.

Specifically, the controller 4 controls the built-in heater 252 to make the temperature of the upper surface of the hot plate 251 higher than the temperature during the heating of the liquid film LF5 of the filler. Then, by the hot plate 251 being positioned at the upper position (position indicated by the solid lines in FIG. 11), a heat amount that is higher than that during the heating of the liquid film LF5 of the filler is applied to the substrate W. The filler contained in the solidified film SF of the filler thereby sublimates and the filler is removed from the pattern forming surface Wa (filler removing step). The filler can be removed from the pattern forming surface Wa without emergence of an interface of a liquid between the structural bodies 101 of the patterns 100 formed on the pattern forming surface Wa and therefore, collapse of the patterns 100 is suppressed.

In this case, not just the solidifying of the liquid film LF5 of the filler but the removal of the filler from the pattern forming surface Wa is also performed in the chamber 7 and therefore the processing time for one substrate W can be shortened further. The improvement of the throughput of processing can thus be achieved even further.

Also, the applying of the heat amount higher than that during the heating of the liquid film LF5 of the filler to the substrate W may be realized by bringing the hot plate 251 closer to the rear surface of the substrate W than the upper position (position indicated by the solid lines in FIG. 11).

Although two modes of the present invention were described above, the present invention can be implemented in yet other modes.

As another mode of the heating unit that heats the pattern forming surface Wa in the second preferred embodiment, a built-in heater capable of generating Joule heat may be incorporated in an interior of the blocking member 9. The pattern forming surface Wa can thereby be heated from above.

Figure 12:
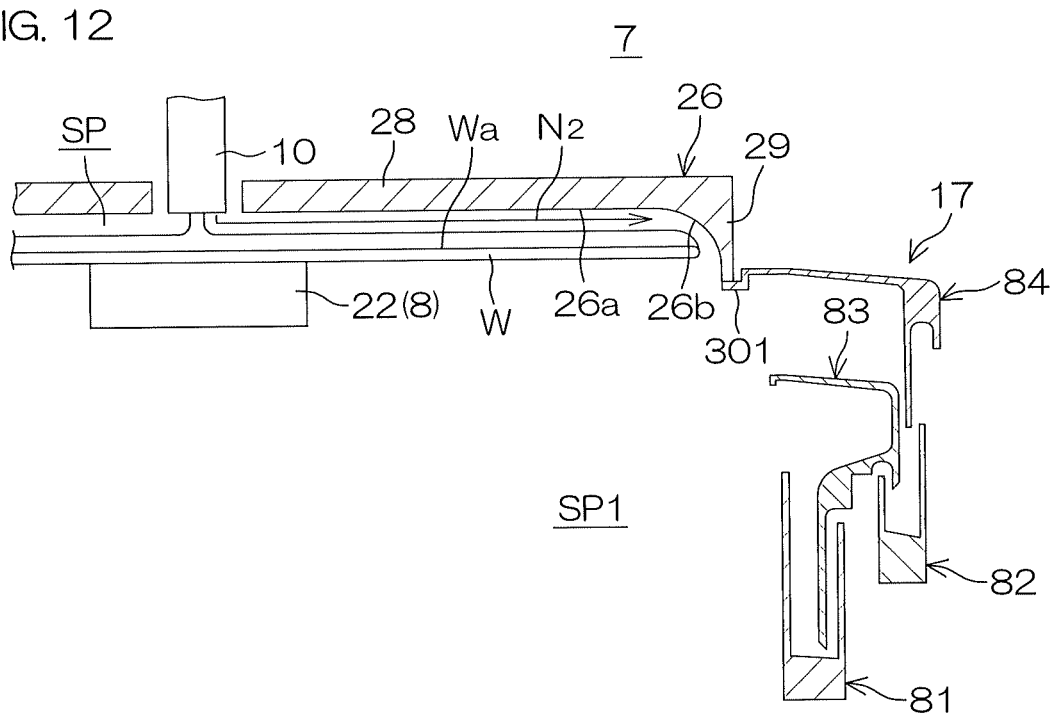
FIG. 12 is a diagram for describing a modification example of the present invention.

In the first and second preferred embodiments, an internal space SP1 of the processing cup 17 (surrounding member) may be sealed from an external space outside the internal space SP1 by the blocking member 9 and the processing cup 17 in the state where the blocking member 9 is positioned at the lower position, for example, as shown in FIG. 12.

Specifically, in the state where the blocking member 9 is positioned at the lower position, the circular cylindrical portion 29 of the blocking member 9 contacts a receiving portion 301 provided at an inner peripheral end of the second guard 84. By the circular cylindrical portion 29 and the receiving portion 301 being put into close contact, the internal space SP1 of the processing cup 17 is sealed from the external space.

When the internal space SP1 of the processing cup 17 is sealed and the internal space SP is blocked from the external space, entry of an oxygen-containing atmosphere into the internal space SP1 of the processing cup 17 is suppressed. The internal space SP between the blocking member 9 and the substrate W can thereby be maintained easily in a low oxygen atmosphere. The oxidation of the pattern forming surface Wa can thus be suppressed or prevented more effectively.

Also, although with each of the first and second preferred embodiments, a mode where the blocking member 9 is elevated toward the upper position prior to start of the filler discharging step was given as an example, the elevation of the blocking member 9 may be performed at or after the start of the filler discharging step (see FIG. 8J) as long as it is performed before start of the filler spreading step (see FIG. 8K). In this case, the filler is discharged from a central portion discharge port (discharge port formed at the lower end of the central nozzle 10) of the blocking member 9 in the filler discharging step.

Also, with the preferred embodiments described above, in the replacing step (step S8 of FIG. 7), the IPA discharged from the central nozzle 10 is supplied to the pattern forming surface Wa and then the IPA discharged from the solvent nozzle 61 is supplied to the pattern forming surface Wa. However, the discharge of the IPA from the central nozzle 10 may be continued even after discharge of the IPA from the solvent nozzle 61.

Also, the IPA discharged from just one nozzle among the central nozzle 10 and the solvent nozzle 61 may be supplied to the pattern forming surface Wa.

Also, depending on the type of the filler, the filler and the rinse liquid may have solubility (miscibility) with respect to each other. In this case, the replacing step (step S8 of FIG. 7) can be omitted. In this case, the rinse liquid functions as the intermediate processing liquid and the rinsing step (step S5 of FIG. 7) functions as the intermediate processing step.

Also, as the chemical liquid processing, the pattern forming surface Wa can also be processed using a plurality of chemical liquids successively. For example, after processing the pattern forming surface Wa by using hydrofluoric acid (hydrofluoric-acid-containing liquid), the pattern forming surface Wa may be processed by using SC1 with the rinsing step (step S5 of FIG. 7) being performed in between.

Also, in the substrate processing examples of the respective preferred embodiments, an edge rinsing step may be executed after the second spin-off step (S12 of FIG. 7). In the edge rinsing step, while rotating the substrate W, a cleaning liquid (a solvent, such as IPA, etc.) is supplied to an outer peripheral portion of the lower surface (surface at the opposite side to the pattern forming surface Wa) of the substrate W from a cleaning liquid nozzle facing the outer peripheral portion of the lower surface of the substrate W to remove the filler from the outer peripheral portion of the lower surface of the substrate W.

Also, in the substrate processing examples of the respective preferred embodiments described above, apart from the upper position of the blocking member 9, a retreat position of the blocking member may be set, for example, above the upper position and the blocking member 9 may be disposed at the retreat position in a non-processing state.

Also, although it was described that the inner peripheral surface 26*b* of the blocking member 9 has an arcuate cross section in the respective preferred embodiments, the inner peripheral surface 26*b* of the blocking member 9 may instead have a cross section of bent shape (that is bent, for example, at a right angle).

Also, although as the blocking member 9 in the respective preferred embodiments, the blocking member 9 of a supported type supported by the supporting arm 31 was described as an example, a blocking member of a driven type supported by a spin base of a spin chuck and rotated in accompaniment with rotation of the spin chuck 8 may be adopted instead.

Also, although with the respective preferred embodiments described above, a configuration where up/down positions of the blocking member 9 and the spin chuck 8 are changed relatively by the blocking member 9 being elevated and lowered was described, a configuration is also allowable where the up/down positions of the blocking member 9 and the spin chuck 8 are changed relatively by both the blocking member 9 and the spin chuck 8 or the spin chuck 8 being elevated and lowered.

Further, although a case where the processing cup 17 is a two-stage cup was described as an example, the processing cup 17 may be a single cup or may be a three-stage cup, or may be a multiple-stage cup of four stages or more instead.

Also, although in the preferred embodiments described above, a case where the substrate processing apparatus is an apparatus that processes the substrate W that is constituted of a semiconductor wafer was described, the substrate processing apparatus may be an apparatus that processes such substrates as substrates for liquid crystal display devices, substrates for FPDs (flat panel displays), such as organic EL (electroluminescence) display devices, etc., substrates for optical disks, substrates for magnetic disks, substrates for magneto-optical disks, substrates for photomasks, ceramic substrates, substrates for solar cells, etc.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A substrate processing method comprising:
   a substrate holding step of making a substrate holding unit hold a substrate in a state where a pattern forming surface on which patterns are formed is faced upward;
   a chemical liquid processing step of maintaining, on the pattern forming surface, a liquid film of a chemical liquid that covers the pattern forming surface, and processing the pattern forming surface by using the chemical liquid contained in the liquid film of the chemical liquid;
   an intermediate processing step of maintaining, on the pattern forming surface, a liquid film of an intermediate processing liquid that covers the pattern forming surface, and processing the pattern forming surface by using the intermediate processing liquid contained in the liquid film of the intermediate processing liquid after the chemical liquid processing step;
   a filler discharging step of discharging a filler being a liquid for filling between the patterns toward the pattern forming surface after the intermediate processing step;
   a filler spreading step of rotating the substrate around a vertical rotational axis to spread the filler supplied to the pattern forming surface toward an outer periphery of the substrate;
   a solidified film forming step of solidifying the filler supplied to the pattern forming surface to form a solidified film of the filler on the pattern forming surface;
   a lower position disposing step of making a blocking member having a disk portion that has a substrate facing surface facing the substrate from above and a circular cylindrical portion that extends downward from an outer peripheral portion of the disk portion be disposed at a lower position of blocking a space above the pattern forming surface from an atmosphere of an external space outside the space and thereafter keeping the blocking member at the lower position prior to start of the chemical liquid processing step; and
   a blocking member elevating step of starting elevation of the blocking member toward an upper position positioned higher than the lower position in a state where the pattern forming surface of the substrate held by the substrate holding unit is covered with the liquid film of the intermediate processing liquid prior to start of the filler spreading step; and
   wherein the chemical liquid processing step includes a step of discharging the chemical liquid toward the pattern forming surface from a central nozzle that has a central portion discharge port facing a central portion of the pattern forming surface and is coupled to the disk portion and
   the filler spreading step includes a step of starting the spreading of the filler on the pattern forming surface in a state where the blocking member is positioned at the upper position.

2. The substrate processing method according to claim 1, wherein, in the state where the blocking member is positioned at the upper position, a lower end of the circular cylindrical portion is positioned higher than an upper end of a processing cup that surrounds the substrate holding unit.

3. The substrate processing method according to claim 1, wherein the blocking member elevating step includes a step of starting the elevation of the blocking member toward the upper position in the state where the pattern forming surface of the substrate held by the substrate holding unit is covered with the liquid film of the intermediate processing liquid prior to start of the filler discharging step, and
the filler discharging step includes a step of starting discharge of the filler to the pattern forming surface in the state where the blocking member is positioned at the upper position.

4. The substrate processing method according to claim 3, wherein the filler discharging step includes a step of not discharging the filler from the central nozzle but discharging the filler toward the pattern forming surface from a filler nozzle that is a filler nozzle provided separately of the central nozzle, being movable along the pattern forming surface, and being housed between the substrate and the blocking member positioned at the upper position.

5. The substrate processing method according to claim 4, wherein a distance in a vertical direction between a discharge port of the filler nozzle and the pattern forming surface in the filler discharging step is the same as a distance in the vertical direction between the central portion discharge port and the pattern forming surface in a state where the blocking member is positioned at the lower position or is shorter than this distance.

6. The substrate processing method according to claim 4, wherein
the chemical liquid processing step includes a chemical liquid supplying step of supplying the chemical liquid to the pattern forming surface,
the intermediate processing step includes an intermediate processing liquid supplying step of supplying the intermediate processing liquid to the pattern forming surface, and
a discharge flow rate of the filler from the filler nozzle in the filler discharging step is less than a supply flow rate of the chemical liquid to the pattern forming surface in the chemical liquid supplying step and less than a supply flow rate of the intermediate processing liquid to the pattern forming surface in the intermediate processing liquid supplying step.

7. The substrate processing method according to claim 1, wherein the filler spreading step includes a high speed rotation step of rotating the substrate at a faster speed than in the chemical liquid processing step and in the intermediate processing step.

8. The substrate processing method according to claim 1, further comprising: a filler settling step of making the filler that is spread across an entirety of the pattern forming surface settle after the filler spreading step.

9. The substrate processing method according to claim 1, wherein the intermediate processing step includes a solvent processing step of maintaining, on the pattern forming surface, a liquid film of a solvent that covers the pattern forming surface and processing the pattern forming surface by using the solvent contained in the liquid film of the solvent.

10. The substrate processing method according to claim 9, wherein the solvent processing step includes a step of discharging the solvent toward the pattern forming surface from at least one of either of the central nozzle and/or a solvent nozzle that is provided separately of the central nozzle and is movable along the pattern forming surface.

11. The substrate processing method according to claim 9, wherein the solvent processing step includes a central discharging step of discharging the solvent toward the pattern forming surface from the central nozzle, and
the method further comprises an intermediate position disposing step of disposing the blocking member from the lower position to an intermediate position set between the lower position and the upper position and at which the lower end of the circular cylindrical portion is positioned at the same height as an upper end of a processing cup that surrounds the substrate holding unit in a middle of the central discharging step.

12. The substrate processing method according to claim 1, further comprising: an inert gas supplying step of discharging an inert gas downward from an inert gas discharge port that is opened at the substrate facing surface of the blocking member from before the start of the chemical liquid processing step.

13. The substrate processing method according to claim 1, wherein the chemical liquid contained in the liquid film of the chemical liquid in the chemical liquid processing step is a chemical liquid that is reduced in dissolved oxygen amount.

14. The substrate processing method according to claim 1, wherein the chemical liquid contained in the liquid film of the chemical liquid in the chemical liquid processing step contains hydrofluoric acid.

15. The substrate processing method according to claim 1, further comprising: a solidified film forming step of heating the substrate to solidify the filler contained in the liquid film of the filler formed on the pattern forming surface to form the solidified film of the filler on the pattern forming surface.

16. The substrate processing method according to claim 15, further comprising: a filler removing step of heating the substrate to sublimate the filler contained in the solidified film of the filler formed on the pattern forming surface to remove the filler from the pattern forming surface.

17. A substrate processing apparatus comprising:
a substrate holding unit that holds a substrate horizontally in a state where a pattern forming surface on which patterns are formed is faced upward;
a substrate rotating unit that is configured to rotate the substrate held by the substrate holding unit around a vertical rotational axis;
a chemical liquid supplying unit that is configured to supply a chemical liquid to the pattern forming surface of the substrate held by the substrate holding unit;
an intermediate processing liquid supplying unit that is configured to supply an intermediate processing liquid to the pattern forming surface of the substrate held by the substrate holding unit;
a filler nozzle that is configured to discharge a filler being a liquid for filling between the patterns toward the pattern forming surface of the substrate held by the substrate holding unit;
a filler supplying unit that is configured to supply the filler to the filler nozzle;
a filler solidifying unit that is configured to solidify the filler supplied to the pattern forming surface of the substrate held by the substrate holding unit;
a blocking member that has a disk portion having a substrate facing surface facing the substrate held by the substrate holding unit from above and a circular cylindrical portion extending downward from an outer peripheral portion of the disk portion;

a blocking member elevating/lowering unit that elevates and lowers the blocking member between a lower position of blocking a space above the pattern forming surface of the substrate held by the substrate holding unit from an atmosphere of an external space outside the space and an upper position positioned higher than the lower position;

a central nozzle that has a central portion discharge port facing a central portion of the pattern forming surface of the substrate held by the substrate holding unit, is coupled to the disk portion, and is supplied with the chemical liquid from the chemical liquid supplying unit; and a controller that controls the chemical liquid supplying unit, the intermediate processing liquid supplying unit, the filler supplying unit, and the blocking member elevating/lowering unit; and wherein the controller is programmed to execute a chemical liquid processing step in which the chemical liquid supplying unit makes the chemical liquid be discharged from the central portion discharge port toward the pattern forming surface of the substrate held by the substrate holding unit to form a liquid film of the chemical liquid that covers the pattern forming surface and maintain the liquid film of the chemical liquid on the pattern forming surface to process the pattern forming surface by using the chemical liquid contained in the liquid film of the chemical liquid, an intermediate processing step of maintaining, on the pattern forming surface, a liquid film of the intermediate processing liquid that is formed by the intermediate processing liquid supplying unit and covers the pattern forming surface and processing the pattern forming surface using the intermediate processing liquid contained in the liquid film of the intermediate processing liquid after the chemical liquid processing step, a filler discharging step in which the filler supplying unit makes the filler be discharged from the filler nozzle toward the pattern forming surface after the intermediate processing step, a filler spreading step of rotating the substrate around the rotational axis by the substrate rotating unit to spread the filler supplied to the pattern forming surface toward an outer periphery of the substrate, a solidified film forming step of making the filler supplied to the pattern forming surface be solidified by the filler solidifying unit to form a solidified film of the filler on the pattern forming surface, a lower position disposing step of disposing the blocking member at the lower position by the blocking member elevating/lowering unit and thereafter keeping the blocking member at the lower position prior to start of the chemical liquid processing step, and a blocking member elevating step of starting elevation of the blocking member from the lower position toward the upper position in a state where the pattern forming surface of the substrate is covered with the liquid film of the intermediate processing liquid prior to start of the filler spreading step, and the filler spreading step includes a step of starting the spreading of the filler on the pattern forming surface in a state where the blocking member is positioned at the upper position.

18. The substrate processing apparatus according to claim 17, wherein the chemical liquid supplying unit includes a dissolved oxygen reducing unit configured to reduce a dissolved oxygen amount in the chemical liquid.

19. The substrate processing apparatus according to claim 17, further comprising: a heater configured such that the substrate held by the substrate holding unit is heated from an opposite side to the pattern forming surface.

20. The substrate processing apparatus according to claim 17, further comprising: a surrounding member that surrounds the substrate holding unit; and wherein an internal space demarcated by the blocking member positioned at the lower position and the surrounding member is sealed from a space outside the internal space.

* * * * *